(12) United States Patent
You et al.

(10) Patent No.: US 8,822,995 B2
(45) Date of Patent: Sep. 2, 2014

(54) DISPLAY SUBSTRATE AND METHOD OF MANUFACTURING THE SAME

(75) Inventors: Chun-Gi You, Hwaseong-si (KR); Kap-Soo Yoon, Seoul (KR); Gug-Rae Jo, Asan-si (KR); Sung-Hoon Yang, Seoul (KR); Ki-Hun Jeong, Cheonan-si (KR); Seung-Hwan Shim, Seongnam-si (KR); Jae-Ho Choi, Seoul (KR)

(73) Assignee: Samsung Display Co., Ltd., Yongin, Gyeonggi Do (KR)

( * ) Notice: Subject to any disclaimer, the term of this patent is extended or adjusted under 35 U.S.C. 154(b) by 1192 days.

(21) Appl. No.: 12/486,542

(22) Filed: Jun. 17, 2009

(65) Prior Publication Data

US 2010/0019996 A1    Jan. 28, 2010

(30) Foreign Application Priority Data

Jul. 24, 2008  (KR) .......................... 10-2008-0071998
Nov. 27, 2008  (KR) .......................... 10-2008-0118880

(51) Int. Cl.
*H01L 29/04*  (2006.01)
*H01L 27/12*  (2006.01)
*H01L 27/32*  (2006.01)
*H01L 29/786*  (2006.01)

(52) U.S. Cl.
CPC ........ *H01L 27/1251* (2013.01); *H01L 27/1225* (2013.01); *H01L 27/1214* (2013.01); *H01L 27/3262* (2013.01); *H01L 29/7869* (2013.01)
USPC ............... 257/57; 438/99; 438/104; 438/149; 438/158; 438/166; 438/151; 438/479; 438/197; 438/609; 438/652; 438/795; 349/43; 349/46; 349/56; 349/149; 349/155; 257/43; 257/49; 257/52; 257/59; 257/67; 257/72; 257/79; 257/80; 257/83; 257/295; 257/347; 257/366; 257/754

(58) Field of Classification Search
USPC ......................................... 345/76; 257/40–62
See application file for complete search history.

(56) References Cited

U.S. PATENT DOCUMENTS

| | | | | |
|---|---|---|---|---|
| 5,852,481 | A | * | 12/1998 | Hwang ........................... 349/43 |
| 6,087,205 | A | * | 7/2000 | Yamamori ..................... 438/158 |
| 7,994,510 | B2 | * | 8/2011 | Jeong et al. ..................... 257/72 |
| 2003/0213955 | A1 | * | 11/2003 | Noguchi et al. ................ 257/59 |
| 2005/0269967 | A1 | * | 12/2005 | Park et al. ..................... 315/222 |
| 2006/0091793 | A1 | | 5/2006 | Baude et al. |
| 2007/0072439 | A1 | * | 3/2007 | Akimoto et al. .............. 438/795 |
| 2007/0152921 | A1 | * | 7/2007 | Osame ........................... 345/76 |

(Continued)

FOREIGN PATENT DOCUMENTS

| | | |
|---|---|---|
| JP | 2003-202588 | 7/2003 |
| JP | 2007-073559 | 3/2007 |
| KR | 1020070084770 | 8/2007 |

*Primary Examiner* — Alexander S Beck
*Assistant Examiner* — Amen Bogale
(74) *Attorney, Agent, or Firm* — F. Chau & Associates, LLC

(57) ABSTRACT

A display substrate includes a switching transistor electrically connected to a gate line and a data line, the data line extending in a first direction substantially perpendicular to the gate line extending in a second direction, the switching transistor including a switching active pattern comprising amorphous silicon, a driving transistor electrically connected to a driving voltage line and the switching transistor, the driving voltage line extended in the first direction, the driving transistor including a driving active pattern comprising a metal oxide; and a light-emitting element electrically connected to the driving transistor.

5 Claims, 31 Drawing Sheets

(56) References Cited

U.S. PATENT DOCUMENTS

| | | | |
|---|---|---|---|
| 2007/0181881 A1* | 8/2007 | Koh et al. | 257/67 |
| 2008/0062095 A1* | 3/2008 | Park et al. | 345/80 |
| 2008/0158108 A1* | 7/2008 | Hwang et al. | 345/76 |
| 2009/0072226 A1* | 3/2009 | Koo et al. | 257/40 |

* cited by examiner

DISPLAY SUBSTRATE AND METHOD OF MANUFACTURING THE SAME

CROSS-REFERENCE TO RELATED APPLICATIONS

This application claims priority to Korean Patent Applications No. 2008-71998, filed on Jul. 24, 2008, and No. 2008-118880, filed on Nov. 27, 2008, the contents of which are herein incorporated by reference in their entireties.

BACKGROUND OF THE INVENTION

1. Technical Field

The present disclosure relates to a display substrate and a method of manufacturing the display substrate, and more particularly, to a display substrate including a light-emitting element and a method of manufacturing the display substrate.

2. Discussion of the Related Art

An organic light-emitting diode (OLED) apparatus includes two electrodes and a light-emitting layer disposed between the two electrodes. The light-emitting layer may comprise an organic material. Excitons are formed in an organic light-emitting layer. The excitons are formed by combining electrons injected from a first electrode through the organic light-emitting layer and holes injected from a second electrode through the organic light-emitting layer. The excitons emit energy in a form of light. The OLED apparatus does not require a separate light source. Thus, the OLED apparatus consumes less power, and maintains an enhanced response time, viewing angle, and contrast ratio in comparison with a liquid crystal display (LCD) apparatus.

An OLED apparatus of an active matrix type includes a switching transistor connected to a signal line and a driving transistor connected to the switching transistor. The switching transistor controls a data voltage provided from the signal line. The driving transistor receives the data voltage from a control electrode of the switching transistor. The driving transistor applies the data voltage to a light-emitting element. The driving transistor requires high mobility and high stability to transmit sufficient current. An active pattern of the driving transistor can be formed using polycrystalline silicon or microcrystalline silicon. However, the polycrystalline silicon or the microcrystalline silicon is formed by crystallizing amorphous silicon at a high temperature. During the high temperature process, upper and lower patterns of the substrates may be misaligned, the uniformity of the polycrystalline silicon or the microcrystalline silicon may be deteriorated, and a leakage current may be generated in the active pattern of the driving transistor. As such, a need exists for a display substrate having a driving transistor with an improved electrical characteristic.

SUMMARY OF THE INVENTION

According to an exemplary embodiment the present invention, a display substrate includes a switching transistor, a driving transistor and a light-emitting element. The switching transistor can be electrically connected to a gate line and a data line crossing the gate line, and the switching transistor includes a switching active pattern formed using amorphous silicon. The driving transistor can be electrically connected to a driving voltage line crossing the gate line and the switching transistor, and the driving transistor includes a driving active pattern formed using a metal oxide. The light-emitting element can be electrically connected to the driving transistor.

The driving transistor may include a driving control electrode, a driving input electrode and a driving output electrode. The switching transistor may include a switching control electrode, a switching input electrode and a switching output electrode.

In an embodiment of the present invention, the driving control electrode and the switching control electrode may be formed by patterning a first conductive layer. The driving input and output electrodes may be formed by patterning a second conductive layer formed on the first conductive layer. The switching active pattern may be formed on the switching control electrode, and the driving active pattern may be formed on the driving control electrode. The driving active pattern may be formed on the driving input electrode and the driving output electrode.

In an embodiment of the present invention, the driving input electrode, the driving output electrode, the switching input electrode and the switching output electrode may be formed by patterning a first conductive layer. The driving control electrode and the switching control electrode may be formed by patterning a second conductive layer formed on the first conductive layer.

In an embodiment of the present invention, the switching control electrode, the driving input electrode and the driving output electrode may be formed by patterning a first conductive layer. The switching input electrode, the switching output electrode and the driving control electrode may be formed by patterning a second conductive layer different from the first conductive layer.

According to an exemplary embodiment of the present invention, a method of manufacturing a display substrate is provided. In the method, a gate line, a switching control electrode and a driving control electrode can be formed by patterning a first conductive layer. A data line, a driving voltage line, a switching input electrode, a switching output electrode, a driving input electrode and a driving output electrode can be formed by patterning a second conductive layer. In forming a switching active pattern, the switching active pattern can be formed using amorphous silicon and formed in a region corresponding to the switching control electrode. In forming a driving active pattern, the driving active pattern can be formed using a metal oxide and formed in a region corresponding to the driving control electrode. The light-emitting element can be electrically connected to the driving output electrode.

According to an exemplary embodiment of the present invention, a method of manufacturing a display substrate is provided. In the method, a gate line and a switching control electrode can be formed by patterning a first conductive layer. A data line, a switching input electrode, a switching output electrode, a driving voltage line, a driving input electrode and a driving output electrode can be formed by patterning a second conductive layer. A driving control electrode can be formed by patterning a third conductive layer. In forming a switching active pattern, the switching active pattern can be formed using amorphous silicon and formed in a region corresponding to the switching control electrode. In forming a driving active pattern, the driving active pattern can be formed using a metal oxide and formed in a region corresponding to the driving control electrode.

According to exemplary embodiments of the present invention, the switching transistor and the driving transistor include active patterns corresponding to driving characteristics thereof, and thus electrical characteristics of the switching transistor and the driving transistor may be improved. Therefore, a display apparatus may have a high resolution and the screen size of the display apparatus may be increased. The display quality may be improved.

According to exemplary embodiments of the present invention, a display substrate, which includes the switching transistor and the driving transistor, may be manufactured at a low temperature, and thus misalignment of the display substrate may be prevented and the reliability of manufacturing the display may be improved.

BRIEF DESCRIPTION OF THE DRAWINGS

Exemplary embodiments of the present invention can be understood in more detail from the following descriptions taken in conjunction with the accompanying drawings in which.

DETAILED DESCRIPTION OF EXEMPLARY EMBODIMENTS

The present invention is described more fully hereinafter with reference to the accompanying drawings, in which exemplary embodiments of the present invention are shown. The present invention may, however, be embodied in many different forms and should not be construed as limited to the exemplary embodiments set forth herein. It will be understood that when an element or layer is referred to as being "on," "connected to" or "coupled to" another element or layer, it can be directly on, connected or coupled to the other element or layer or intervening elements or layers may be present.

Figure 1A:
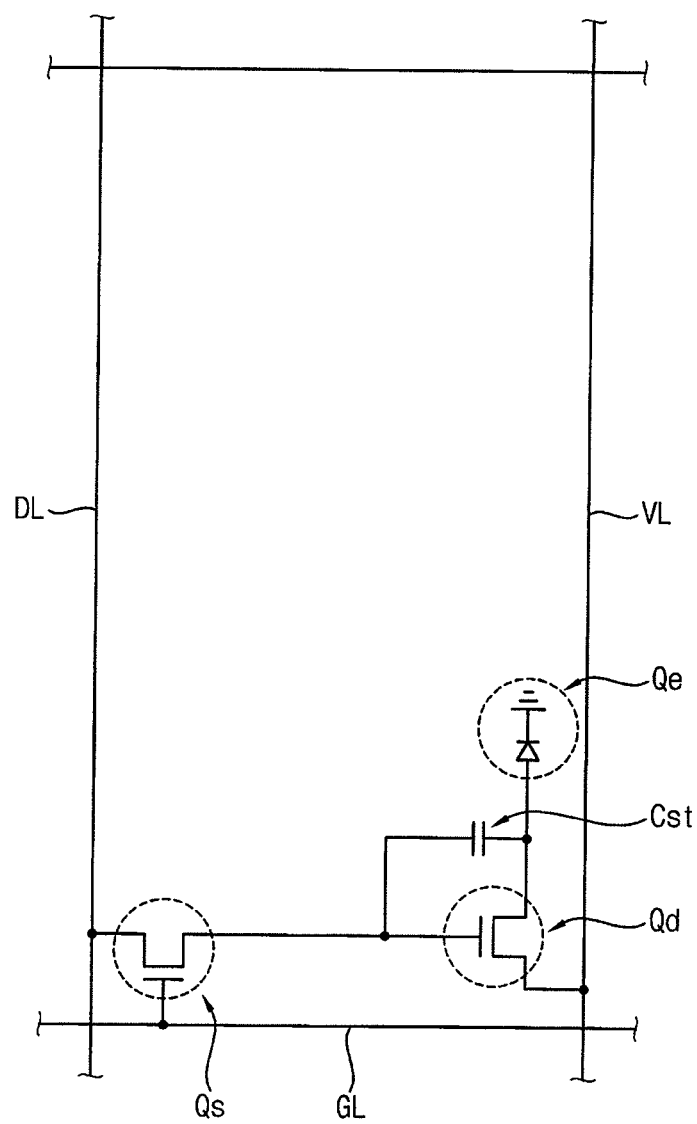
FIG. 1A is a circuit diagram illustrating a display apparatus according to an exemplary embodiment of the present invention.
Figure 1B:
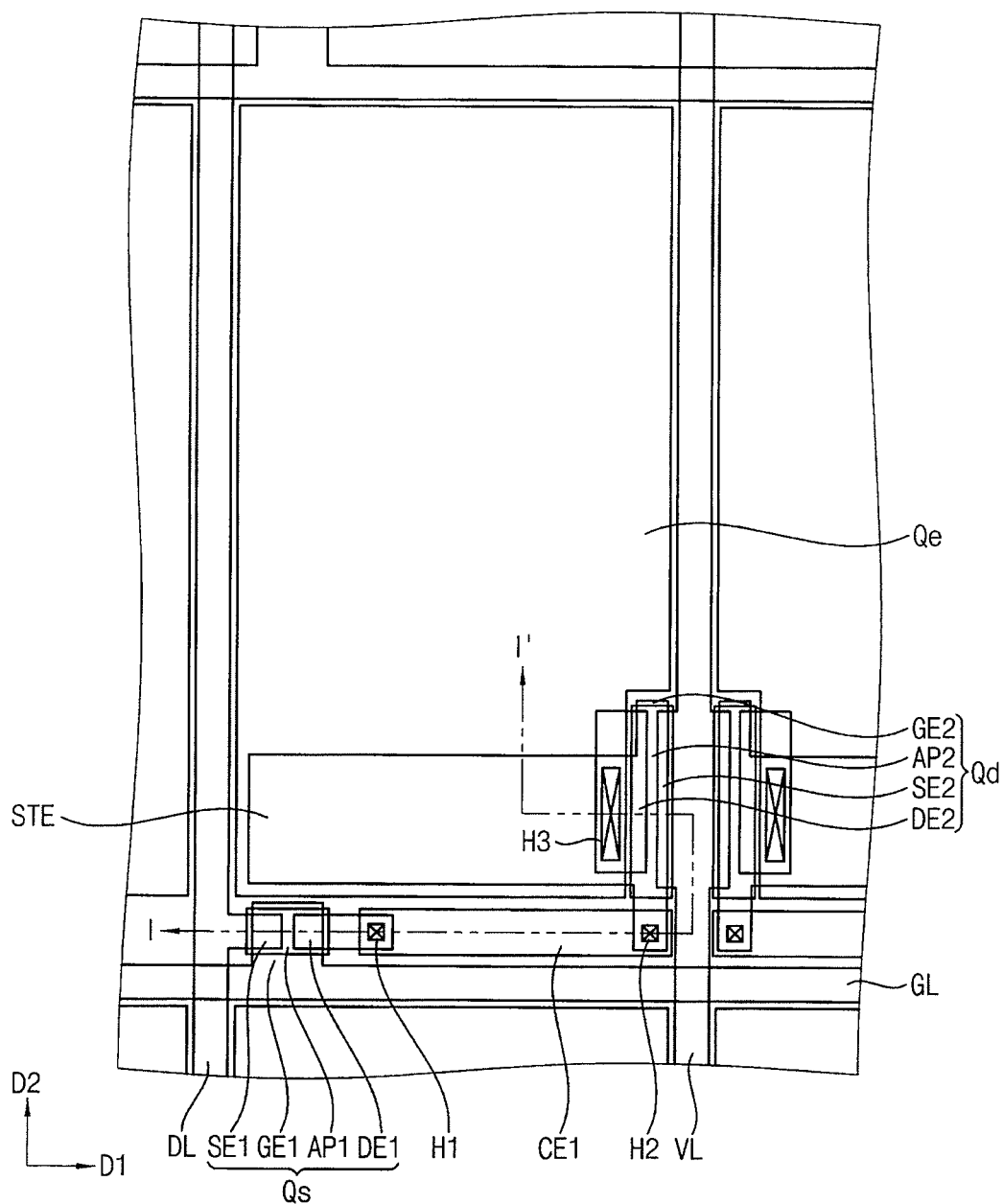
FIG. 1B is a plan view illustrating a display substrate according to an exemplary embodiment of the present invention.
Figure 2:
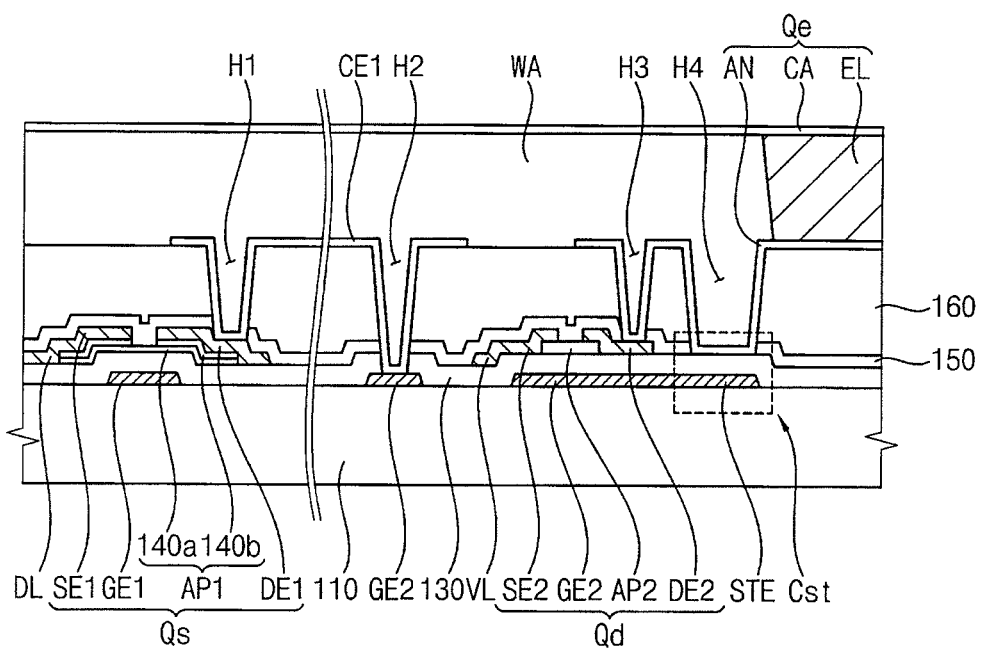
FIG. 2 is a cross-sectional view taken along the line I-I' shown in FIG. 1B according to an exemplary embodiment of the present invention.

FIG. 1A is a circuit diagram illustrating a display apparatus according to an exemplary embodiment of the present invention. FIG. 1B is a plan view illustrating a display substrate of a display apparatus according to an exemplary embodiment of the present invention. FIG. 2 is a cross-sectional view taken along the line I-I' shown in FIG. 1B according to an exemplary embodiment of the present invention.

Referring to FIGS. 1A, 1B and 2, a display substrate 101 includes a plurality of signal lines GL, DL and VL and a plurality of pixel units connected to the signal lines GL, DL and VL. The pixel units may be arranged in substantially a matrix. The signal lines GL, DL and VL may include a gate line GL, a data line DL and a driving voltage line VL. Each of the pixel units may include a switching transistor Qs, a driving transistor Qd, a light-emitting element Qe and a storage capacitor Cst.

The display substrate 101 may include a first insulation layer 130 and a second insulation layer 150. The first insulation layer 130 may be formed on the gate line GL. The second insulation layer 150 may be formed on the data line DL and the driving voltage line VL. The display substrate 101 may include a third insulation layer 160 and an insulation wall WA formed on the third insulation layer 160.

The gate line GL may serve as a signal line transmitting a gate signal or a subject signal. The gate line GL may extend in a first direction D1. A plurality of the gate lines GL may be arranged in parallel to each other in a second direction D2. The second direction D2 may be substantially perpendicular to the first direction D1.

The data line DL may serve as a signal line transmitting a data signal. The data line DL may extend in the second direction D2. A plurality of the data lines DL may be arranged in parallel to each other in the first direction D1. The data line DL may cross the gate line GL.

The driving voltage line VL may serve as a signal line transmitting a driving voltage to the light-emitting element Qe. The driving voltage line VL may be disposed between the data lines DL adjacent to each other. The driving voltage line VL may apply the driving voltage to pixels adjacent to each other in the first direction D1.

The switching transistor Qs may apply the data signal to the driving transistor Qd. The data signal is generated in response to the gate signal of the gate line GL. The switching transistor Qs may include a switching control electrode GE1, a switching active pattern AP1, a switching input electrode SE1 and a switching output electrode DE1.

The switching control electrode GE1 may be connected to the gate line GL. The switching input electrode SE1 may be connected to the data line DL. The switching input electrode SE1 may be formed on the switching active pattern AP1 and may partially overlap an edge portion of the switching control electrode GE1. The switching output electrode DE1 may be spaced apart from the switching input electrode SE1. The switching output electrode DE1 may be formed on the switching active pattern AP1 and may partially overlap an opposite edge portion of the switching control electrode GE1. The switching output electrode DE1 may be connected to a driving control electrode GE of the driving transistor Qd. The switching transistor Qs may be connected to the driving transistor Qd.

The switching active pattern AP1 may be formed on the first insulation layer 130 formed on the switching control electrode GE1. The switching active pattern AP1 may include an amorphous silicon layer 140a as a semiconductor layer. The amorphous silicon layer 140a may comprise, for example, amorphous silicon (a-Si). The switching active pattern AP1 may include an ohmic contact layer 140b to decrease a contact resistance between the amorphous silicon layer 140a and the switching input electrode SE1 and between the amorphous silicon layer 140a and the switching output electrode DE1. The ohmic contact layer 140b may comprise, for example, amorphous silicon through which n+ impurities are implanted with a high concentration (n+a-Si).

The switching transistor Qs may serve as an element for turning on/off the driving transistor Qd to drive the light-emitting element Qe. Thus, the switching active pattern AP1 of the switching transistor Qs may be formed on the base substrate 110 having a wide area in a low temperature process of less than about 400° C. using amorphous silicon. The amorphous silicon is less sensitive to voltage stress than other semiconductor materials such as polycrystalline silicon or microcrystalline silicon. Damage to the lower layer and/or the base substrate 110 may be minimized by using the switching active pattern AP1 in the low temperature process. In an exemplary embodiment, the display substrate 101 may have a large size by using the switching active pattern AP1. Thus, the reliability and productivity of the display substrate 101 may be improved.

The driving transistor Qd may receive the data signal from the switching output electrode DE1 to the driving control electrode GE2. The driving transistor Qd may apply the driving voltage of the driving voltage line VL to the light-emitting element Qe. The driving transistor Qd may include the driving control electrode GE2, a driving active pattern AP2, a driving input electrode SE2 and a driving output electrode DE2.

The driving control electrode GE2 may be electrically connected to the switching output electrode DE1. In an exemplary embodiment, the driving control electrode GE2 may be connected to the switching output electrode DE1 through a first connection electrode CE1. The first connection electrode CE1 may be connected to the switching output electrode DE1 through a first hole H1 formed through the second insulation layer 150 and the third insulation layer 160. The first connection electrode CE1 may be connected to the driving control electrode GE2 through a second hole H2 formed through the first, second and third insulation layers 130, 150 and 160. The driving input electrode SE2 may be connected to the driving voltage line VL and formed on the driving active pattern AP2 to overlap an edge portion of the driving control electrode GE2. The driving output electrode DE2 may be spaced apart from the driving input electrode SE2 and formed on the driving active pattern AP2 to overlap an opposite edge portion of the driving control electrode GE2. The driving output electrode DE2 may be connected to an anode AN of the light-emitting element Qe through a third hole H3 formed through the second insulation layer 150 and the third insulation layer 160.

The driving active pattern AP2 may be formed on the first insulation layer 130 corresponding to the driving control electrode GE2. The driving active pattern AP2 may comprise, for example, a metal oxide including gallium (Ga), indium (In), tin (Sn), zinc (Zn), lithium (Li), beryllium (Be), sodium (Na), magnesium (Mg), calcium (Ca), scandium (Sc), titanium (Ti), vanadium (V), manganese (Mn), iron (Fe), nickel (Ni), copper (Cu), yttrium (Y), zirconium (Zr), niobium (Nb), ruthenium (Ru), palladium (Pd), cadmium (Cd), tantalum (Ta), tungsten (W), boron (B), carbon (C), nitrogen (N), fluorine (F), aluminum (Al), silicon (Si), phosphorus (P), germanium (Ge), or a combination thereof. The driving active pattern AP2 may include a single metal compound comprising, for example, gallium oxide, indium oxide, tin oxide, zinc oxide, or a combination thereof. The driving active pattern AP2 may include a multiple metal compound comprising, for example, gallium indium zinc oxide ($Ga_2O_3$—$In_2O_3$—ZnO, GIZO), indium gallium tin oxide ($In_2O_3$-$Ga_2O_3$—SnO), indium zinc oxide ($In_2O_3$—$Zn_2O_3$), zinc aluminum oxide ($Zn_2O_3$—$Al_2O_3$), or a combination thereof.

The mobility of the metal oxide may be about 3 $cm^2/V·s$ to about 10 $cm^2/V·s$. The mobility of the metal oxide may be higher than the mobility of amorphous silicon, which may be about 0.5 $cm^2/V·s$, or the mobility of polysilicon, which may be about 1.5 $cm^2/N·s$. Thus, the driving transistor Qd may transmit more electrons than the switching transistor Qs to apply sufficient current to the light-emitting element Qe through the driving active pattern AP2.

An on/off-currents ratio ($I_{on}/I_{off}$) of the metal oxide, which is determined by dividing an on-current value ($I_{on}$) by an off-current value ($I_{off}$), is about $1 \times 10^7$. The on/off-currents ratio ($I_{on}/I_{off}$) is about ten times to about hundred times higher than that of the polysilicon. The on/off-currents ratio ($I_{on}/I_{off}$) of the polysilicon is about $1 \times 10^5$ to about $1 \times 10^6$. The off-current value ($I_{off}$) of the metal oxide may be lower than that of the polysilicon. The driving active pattern AP2 including the metal oxide can minimize the leakage current. The minimized off-current value of the polysilicon may be about 1 nanoampere (nA) to about 1 picoampere (pA). The off-current value ($I_{off}$) of the metal oxide may be less than about 1 pA.

The driving active pattern AP2 including the metal oxide may be insensitive to current stress. Thus, the driving transistor Qd may be formed on the base substrate 110 having a wide area in a low temperature process. Thus, damage to the lower layer and/or the base substrate 110 may be minimized by using the driving active pattern AP2 in the low temperature process. The size of the display substrate 101 may be increased by using the driving active pattern AP2. Thus, the reliability and productivity of the display substrate 101 may be improved.

Figure 3:
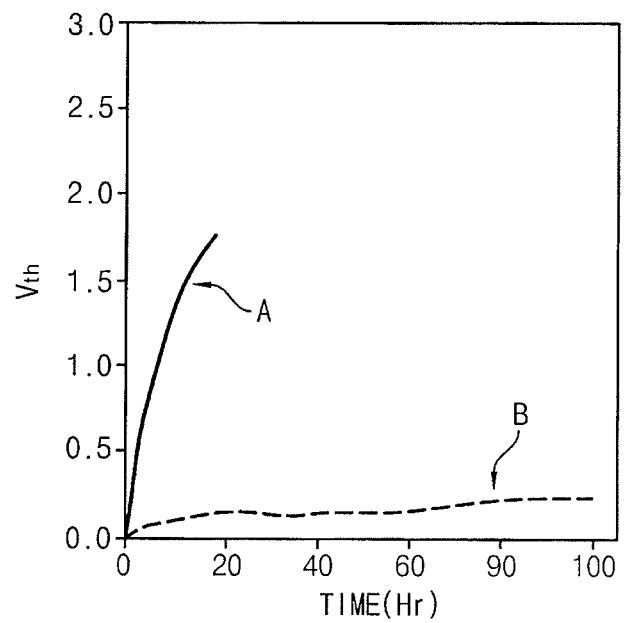
FIG. 3 is a graph illustrating electrical characteristics of a driving transistor according to an exemplary embodiment of the present invention.

FIG. 3 is a graph illustrating electrical characteristics of a driving transistor according to an exemplary embodiment of the present invention.

Referring to FIG. 3, "A" represents a threshold voltage ($V_{th}$) according to time in a transistor including a semiconductor pattern comprising amorphous silicon. "B" represents a threshold voltage ($V_{th}$) according to time in a transistor including a semiconductor pattern comprising a metal oxide.

The threshold voltage ($V_{th}$) of the transistor including the semiconductor pattern comprising a metal oxide is about 0.25 V after about 100 hours. The threshold voltage ($V_{th}$) of the transistor including the semiconductor pattern comprising amorphous silicon increases from about 0 V to about 1.75 V after about 20 hours. As such, the threshold voltage ($V_{th}$) of the transistor including the semiconductor pattern comprising the amorphous silicon changes dramatically as compared to the semiconductor pattern comprising the metal oxide. The transistor including the semiconductor pattern comprising the metal oxide may be less sensitive to the current stress than the transistor including the semiconductor pattern comprising the amorphous silicon. Thus, the transistor including the semiconductor pattern comprising the metal oxide may prevent the increase of the power consumption.

The light-emitting element Qe may include the anode AN connected to the driving output electrode DE2, a cathode CA facing the anode AN and a light-emitting layer EL interposed between the anode AN and the cathode CA. The anode AN may provide electron holes to the light-emitting layer EL, and the cathode CA may provide electrons to the light-emitting layer EL. The electron holes may be combined with the electrons to form excitons in the light-emitting layer EL.

In an exemplary embodiment, the light-emitting element Qe may include, for example, an electron hole injection layer, an electron hole transport layer, an electron injection layer, or an electron transport layer, interposed between the anode AN and the cathode CA.

The storage capacitor (Cst) may include a storage electrode STE. The storage electrode STE may serve as a first electrode of the storage capacitor (Cst). The first insulation layer 130 formed on the storage electrode STE may serve as a dielectric layer. The anode AN formed on the storage electrode STE may serve as a second electrode facing the first electrode. The storage electrode STE may be connected to the driving control electrode GE2. A fourth hole H4 may be formed by removing the third insulation layer 160 corresponding to the storage electrode STE. The electric capacity of the storage capacitor (Cst) may be increased by forming the fourth hole H4.

In an exemplary embodiment, a protective layer and/or a moisture absorption layer may be formed on the base substrate 110 including the light-emitting element Qe. An opposite substrate may be combined with the base substrate 110 including the light-emitting element Qe to protect the light-emitting element Qe from the moisture penetration or physical shock. Forming a plurality of the switching transistors Qs and/or a plurality of the driving transistors Qd may prevent the light-emitting element Qe and the driving transistor Qd from the heat.

FIGS. 4A to 4G are cross-sectional views illustrating a method of manufacturing a display substrate according to an exemplary embodiment of the present invention.

Figure 4A:
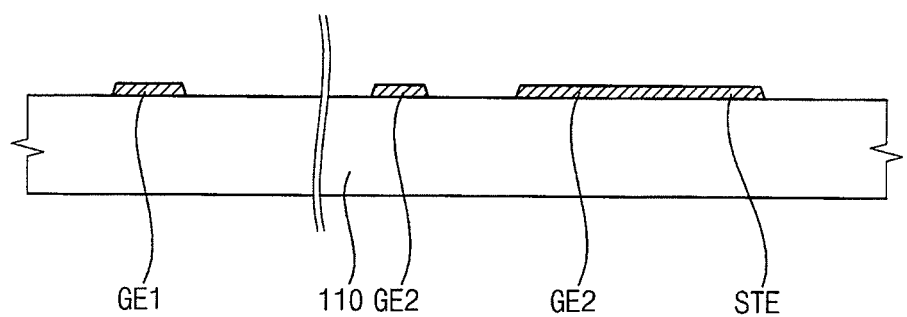
FIGS. 4A to 4G are cross-sectional views illustrating a method of manufacturing a display substrate according to an exemplary embodiment of the present invention.

Referring to FIG. 4A, a first conductive pattern may be formed on the base substrate 110. The first conductive pattern includes the switching control electrode GE1, the driving control electrode GE2, the gate line GL and the storage electrode STE. A first conductive layer may be formed on the base substrate 110. The first conductive layer may be patterned by a photolithography process to form the first conductive pattern.

The base substrate 110 may be transparent and have insulating characteristics. The base substrate 110 may be, for example, a glass substrate, a soda lime substrate, or a plastic substrate.

The first conductive layer may comprise a single-layer. The first conductive layer may comprise a multilayer structure including metal layers having physical characteristics different from each other. The first conductive layer may comprise, for example, aluminum (Al), copper (Cu), molybdenum (Mo), titanium (Ti), tantalum (Ta), tungsten (W), neodymium (Nd), chromium (Cr), or silver (Ag).

Figure 4B:
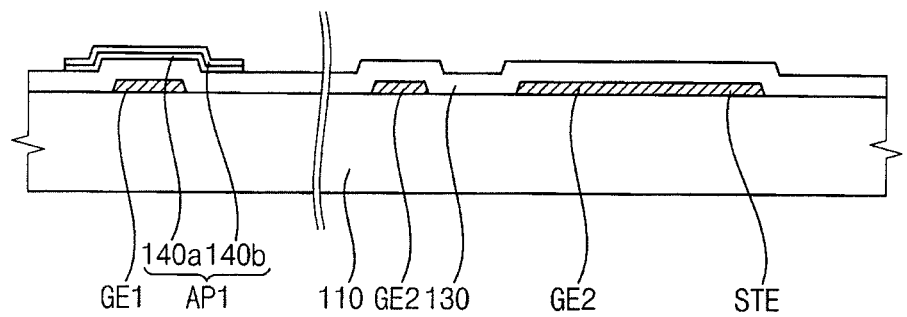

Referring to FIG. 4B, the first insulation layer 130, the amorphous silicon layer 140a and the ohmic contact layer 140b may be formed on the base substrate 110 having the first conductive pattern.

The amorphous silicon layer 140a and the ohmic contact layer 140b may be patterned to form the switching active pattern AP1 on the switching control electrode GE1. The amorphous silicon layer 140a and the ohmic contact layer 140b may be formed by plasma-enhanced chemical vapor deposition (PECVD) on the base substrate 110 having the first insulation layer 130.

Figure 4C:
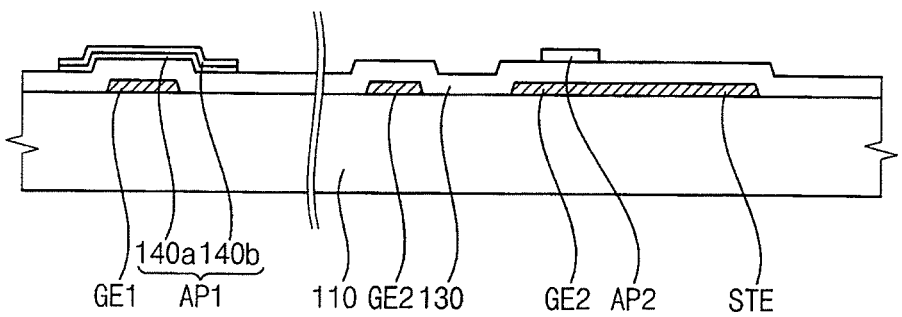

Referring to FIG. 4C, a metal oxide layer may be formed on the base substrate 110 having the switching active pattern AP1. The metal oxide layer may be patterned to form the driving active pattern AP2.

The metal oxide layer may be formed by, for example, a sputtering process on the base substrate 110. The metal oxide layer may be patterned by a photolithography process to form the driving active pattern AP2 on the first insulation layer 130 formed on the driving control electrode GE2. The metal oxide layer may be formed by, for example, metal-organic chemical vapor deposition (MOCVD).

In an exemplary embodiment, the metal oxide layer may be wet-etched by using an etching solution comprising, for example, hydrochloric acid (HCl), acetic acid ($CH_3COOH$), nitric acid ($HNO_3$), or sulfuric acid ($H_2SO_4$) to form the driving active pattern AP2. In an exemplary embodiment, the metal oxide layer may be dry-etched by using an etching gas comprising, for example, methane gas ($CH_4$), argon gas or trifluoromethane ($CHF_3$).

In FIGS. 4B and 4C, the driving active pattern AP2 may be formed after forming the switching active pattern AP1. In an exemplary embodiment, the switching active pattern AP1 may be formed after forming the driving active pattern AP2.

Figure 4D:
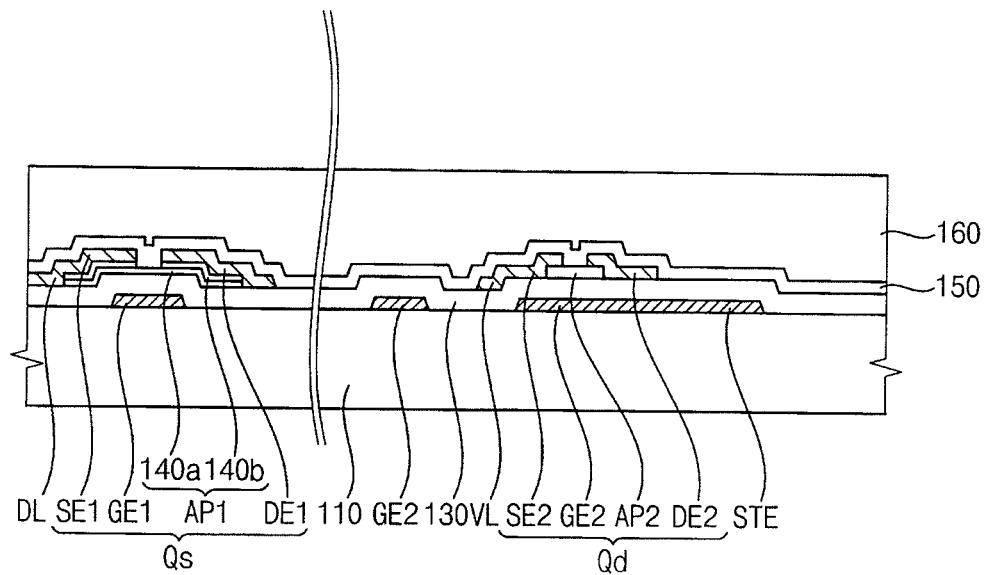

Referring to FIG. 4D, a second conductive pattern may be formed on the base substrate 110 having the switching active pattern AP1 and the driving active pattern AP2. The second conductive pattern may include the data line DL, the switching input electrode SE1, the switching output electrode DE1, the driving voltage line VL, the driving input electrode SE2 and the driving output electrode DE2.

A second conductive layer may be formed on the base substrate 110 having the switching active pattern AP1 and the driving active pattern AP2. The second conductive layer may be patterned by a photolithography process to form the second conductive pattern. The second conductive layer may comprise a single-layer. The second conductive layer may comprise a multilayer structure comprising metal layers having physical characteristics different from each other. The second conductive layer may comprise, for example, aluminum (Al), copper (Cu), molybdenum (Mo), titanium (Ti), tantalum (Ta), tungsten (W), neodymium (Nd), chromium (Cr), or silver (Ag).

When the second conductive layer has a multilayer structure, a lower layer, contacting the driving active pattern AP2 and disposed in the lowest position, may be formed using a metal lowering the contact resistance between the driving active pattern AP2 and the driving input electrode SE2 and/or between the driving active pattern AP2 and the driving output electrode DE2.

A portion of the ohmic contact layer 140b in the switching active pattern AP1 may be exposed by a space between the switching input electrode SE1 and the switching output electrode DE1. The portion of the ohmic contact layer 140b may be removed.

The second insulation layer 150 and the third insulation layer 160 may be formed on the base substrate 110 having the second conductive pattern.

Figure 4E:
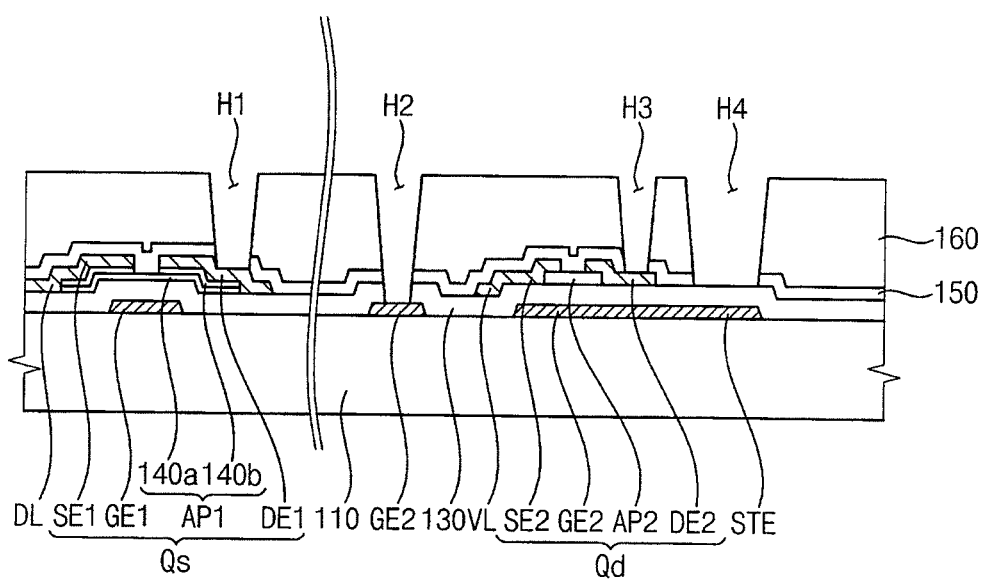

Referring to FIG. 4E, the second insulation layer 150 and the third insulation layer 160 formed on the switching output electrode DE1 may be removed to form the first hole H1 exposing a portion of the switching output electrode DE1. The first, second and third insulation layers 130, 150 and 160 may be removed to form the second hole H2 exposing a portion of the driving control electrode GE2. The second and third insulation layers 150 and 160 formed on the driving control electrode GE2 may be removed to form the third hole H3 and the fourth hole H4.

Figure 4F:
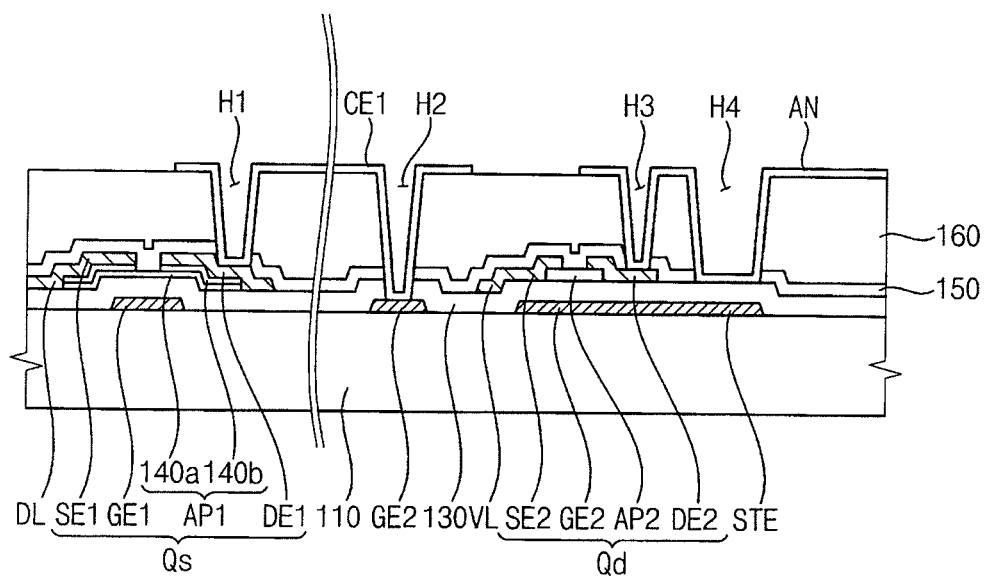

Referring to FIG. 4F, a third conductive layer may be formed on the base substrate 110 having the first, second, third and fourth holes H1, H2, H3 and H4. The third conductive layer may be patterned by a photolithography process to form the first connection electrode CE1 and the anode AN.

A material that may be used for the third conductive layer may have a high work function and conductivity. The material can be transparent. The third conductive layer may comprise, for example, indium zinc oxide, indium tin oxide, vanadium oxide, molybdenum oxide, or ruthenium oxide. The third conductive layer may be connected to the switching output electrode DE1 through the first hole H1, connected to the driving control electrode GE2 through the second hole H2, and connected to the driving output electrode DE2.

Figure 4G:
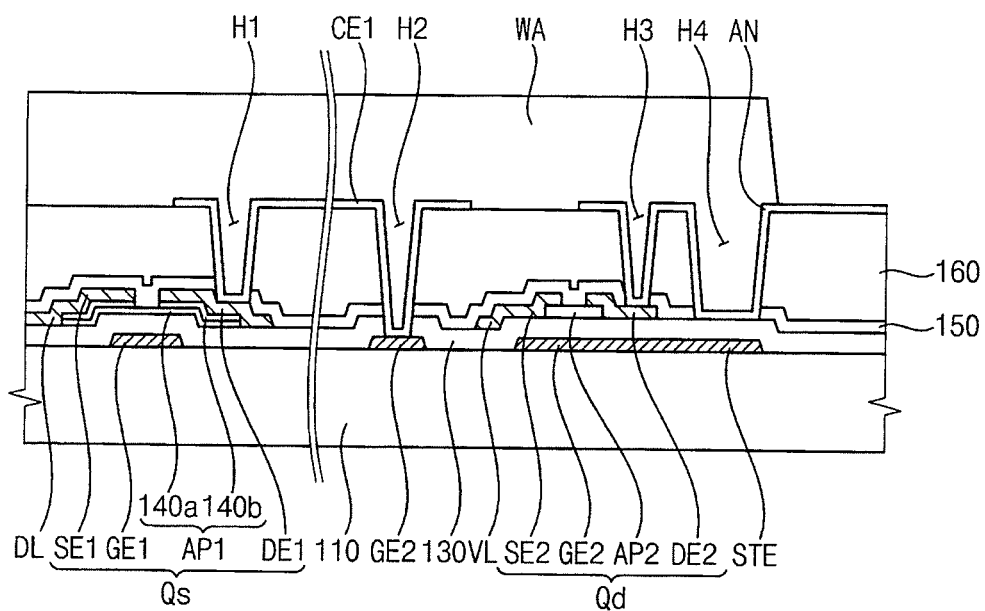

Referring to FIG. 4G, an organic layer may be formed on the base substrate 110 having the first connection layer CE1 and the anode AN. The organic layer may be patterned to form the insulation wall WA. The insulation wall WA may expose the anode AN.

The light-emitting layer EL may be formed on the anode AN exposed by the insulation wall WA. The cathode CA may be formed on the base substrate 110 having the light-emitting layer EL. The cathode CA may comprise a material having a low work function such as, for example, cesium (Cs), radium (Ra), or calcium (Ca). The cathode CA may comprise a material having a high work function and that can be easily formed on the light-emitting layer EL such as, for example, aluminum (Al), copper (Cu), or silver (Ag).

Figure 5:
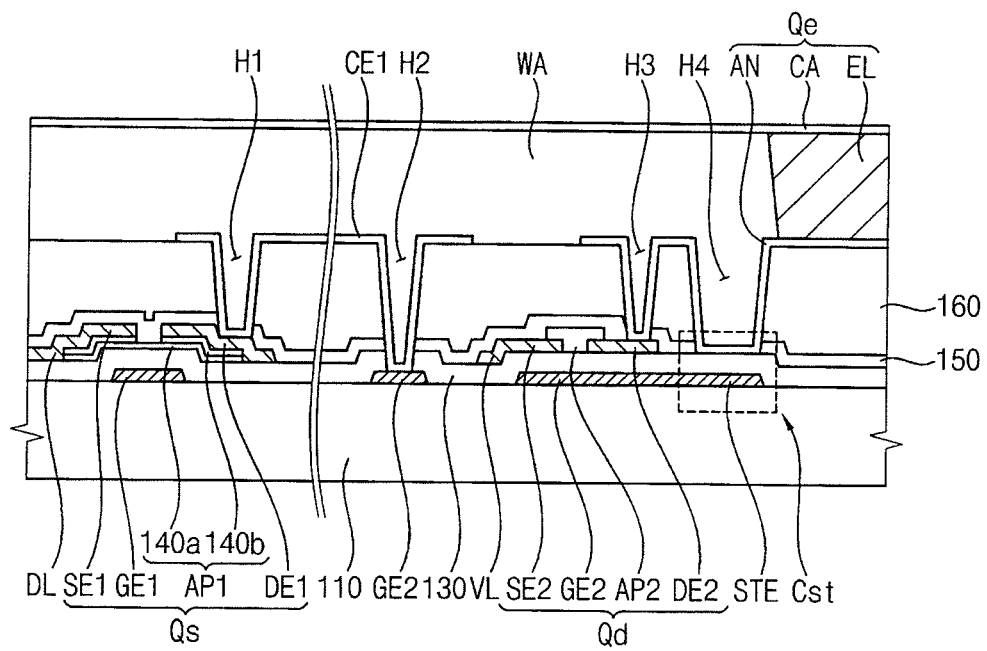
FIG. 5 is a cross-sectional view illustrating a display substrate according to an exemplary embodiment of the present invention.

According to an exemplary embodiment, the switching transistor Qs and the driving transistor Qd include active patterns comprising amorphous silicon and metal oxide, respectively. Thus, electrical characteristics of the switching transistor and the driving transistor may be improved. Thus, a display apparatus may have a high resolution, and the screen size of the display apparatus may be increased. In an exemplary embodiment, the electrical characteristics of the driving active pattern AP2 may be substantially the same as that of polysilicon. The driving active pattern AP2 may be formed at a low temperature. Thus, misalignment of the display substrate may be prevented. In an exemplary embodiment, the switching control electrode GE1 and the driving control electrode GE2 may be formed by patterning the first conductive layer, and the switching and driving input electrodes SE1 and SE2 and the switching and driving output electrodes DE1 and DE2 may be formed by patterning the second conductive layer. Thus, a process of manufacturing the display substrate may be simplified. FIG. 5 is a cross-sectional view illustrating a display substrate according to an exemplary embodiment of the present invention.

In FIG. 5, a display substrate 102 is substantially the same as the display substrate 101 except for a position of the driving active pattern AP2.

Referring to FIG. 5, the display substrate 102 includes a switching transistor Qs, a driving transistor Qd and a light-emitting element Qe.

The switching transistor Qs may include the first active pattern AP1 comprising amorphous silicon.

The driving transistor Qd may include the driving control electrode GE2 formed on the base substrate 110, the driving input electrode SE2 and the driving output electrode DE2 formed on the first insulation layer 130 which are formed on the driving control electrode GE2, and the driving active pattern AP2 formed on the driving input and output electrodes SE2 and DE2. The driving active pattern AP2 may comprise, for example, a metal oxide.

Figure 6A:
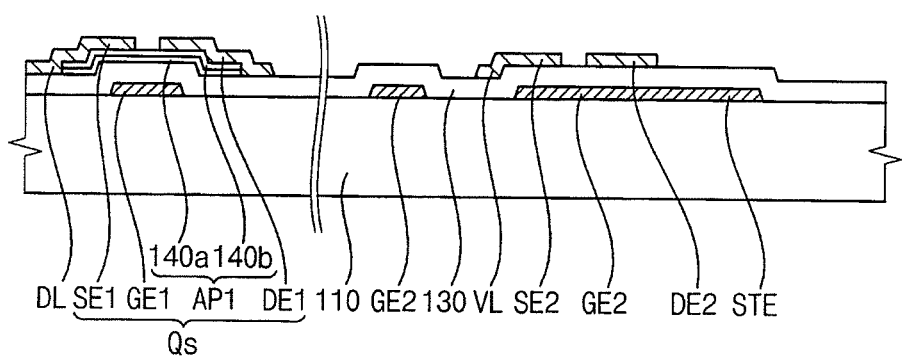
FIGS. 6A to 6C are cross-sectional views illustrating a method of manufacturing a display substrate according to an exemplary embodiment of the present invention.
Figure 6B:
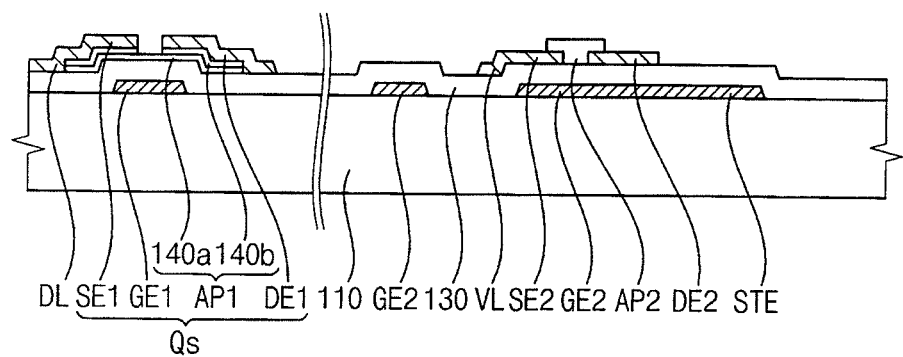
Figure 6C:
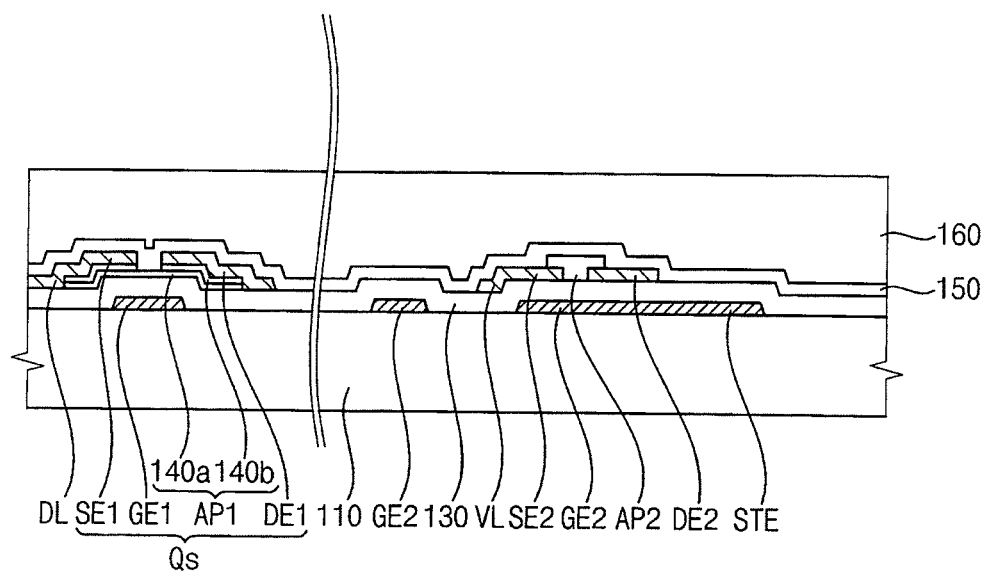

FIGS. 6A to 6C are cross-sectional views illustrating a method of manufacturing a display substrate according to an exemplary embodiment of the present invention.

Referring to FIG. 6A, the first conductive pattern including a switching control electrode GE1, the driving control electrode GE2 and the storage electrode STE may be formed on the base substrate 110. A first conductive layer may be formed on the base substrate 110, and the conductive layer may be patterned by a photolithography process to form the first conductive pattern.

The first insulation layer 130 may be formed on the base substrate 110 having the first conductive pattern.

The switching active pattern AP1 may be formed on the first insulation layer 130 formed on the switching control electrode GE1.

A second conductive pattern including a switching input electrode SE1, a switching output electrode DE1, the driving input electrode SE2 and the driving output electrode DE2 may be formed on the base substrate 110 having the switching active pattern AP1. The second conductive pattern may be formed by patterning a second conductive layer using, for example, a photolithography process.

Referring to FIG. 6B, the driving active pattern AP2 may be formed on the base substrate 110 having the driving input electrode SE2 and the driving output electrode DE2. A metal oxide layer may be formed by sputtering a metal oxide on the base substrate 110 having the second conductive pattern. The metal oxide layer may be patterned by a photolithography process to form the driving active pattern AP2.

Referring to FIG. 6C, a second insulation layer 150 and a third insulation layer 160 may be formed on the base substrate 110 having the driving active pattern AP2. The second and third insulation layers may be patterned to form a first hole H1, a second hole H2, a third hole H3 and a fourth hole H4.

In a method of manufacturing the display substrate 102 according to an exemplary embodiment of the present invention, processes after patterning the second and third insulation layers 150 and 160 are substantially the same as the method of manufacturing the display substrate 101.

According to an exemplary embodiment, the driving active pattern AP2 may not be exposed by an etching solution etching the second conductive layer to form the driving input electrode SE2 and the driving output electrode DE. Thus, damage to the driving active pattern AP2 may be prevented. In an exemplary embodiment, the switching transistor Qs and the driving transistor Qd include active patterns comprising amorphous silicon and metal oxide, respectively. Thus, electrical characteristics of the switching transistor Qs and the driving transistor Qd may be improved. Thus, the display substrate 102 may have a high resolution and the screen size of the display apparatus may be increased.

Figure 7:
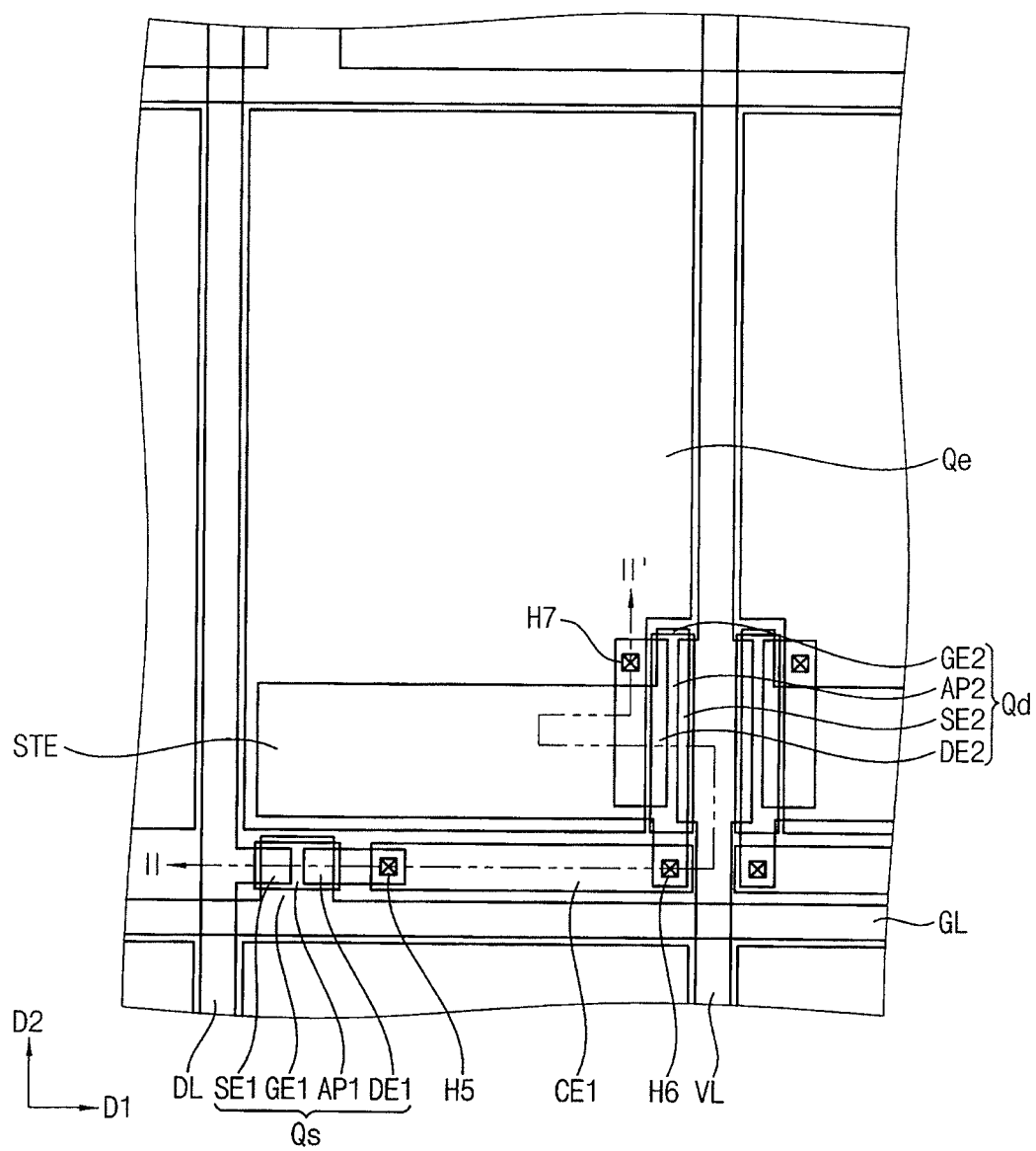
FIG. 7 is a plan view illustrating a display substrate according to an exemplary embodiment of the present invention.
Figure 8:
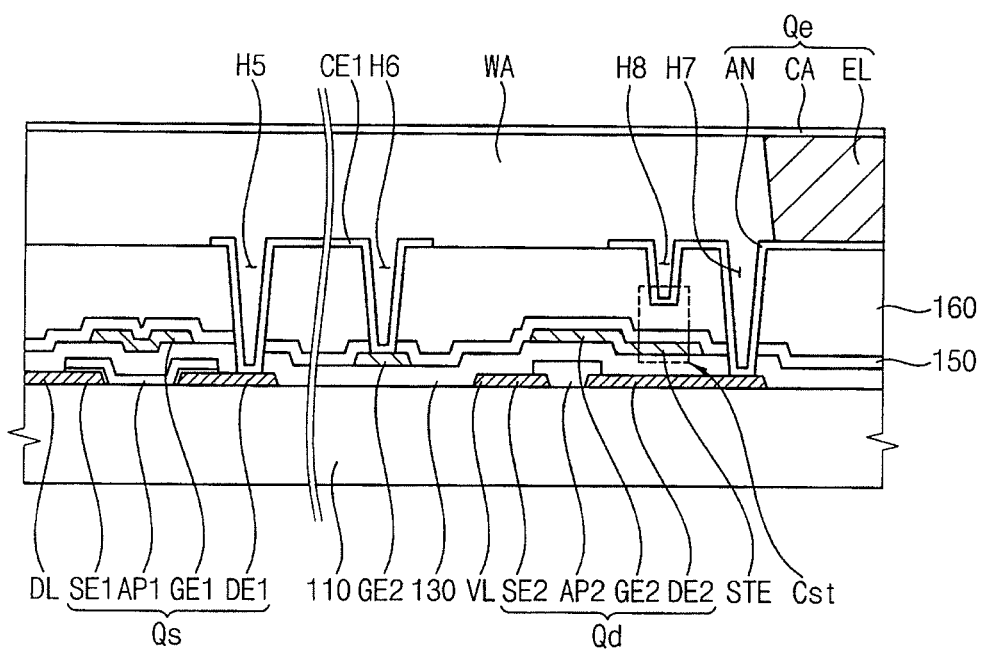
FIG. 8 is a cross-sectional view taken along the line II-II' shown in FIG. 7 according to an exemplary embodiment of the present invention.

FIG. 7 is a plan view illustrating a display substrate according to an exemplary embodiment of the present invention. FIG. 8 is a cross-sectional view taken along the line II-II' shown in FIG. 7 according to an exemplary embodiment of the present invention.

In FIGS. 7 and 8, a display substrate 103 according to an exemplary embodiment is substantially the same as the display substrate 101 except for a structure of layers of the display substrate 103.

Referring to FIGS. 7 and 8, the display substrate 103 according to an exemplary embodiment includes a switching transistor Qs, a driving transistor Qd and a light-emitting element Qe.

The switching transistor Qs may include a switching input electrode SE connected to a data line DL1, a switching output electrode DE1 spaced apart from the switching input electrode SE1, a switching active pattern AP1 formed on the switching input electrode SE1 and the switching output electrode DE1, and a switching control electrode GE1 formed on the switching active pattern AP1 and connected to a gate line GL1.

The switching output electrode DE1 of the switching transistor Qs may be electrically connected to a driving control electrode GE2 of the driving transistor Qd through a first connection electrode CE1. The switching active pattern AP1 may comprise, for example, amorphous silicon.

The driving transistor Qd may include a driving input electrode SE2 connected a driving voltage line VL, a driving output electrode DE2 spaced apart from the driving input electrode SE2, a driving active pattern AP2 formed on the driving input electrode SE2 and the driving output electrode DE2, and a driving control electrode GE2 formed on the driving active pattern AP2. The driving output electrode DE2 may be electrically connected to an anode AN of the light-emitting element Qe.

Figure 9A:
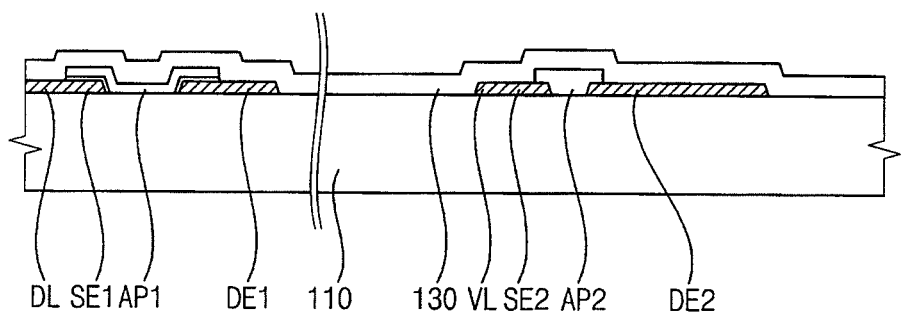
FIGS. 9A and 9B are cross-sectional views illustrating a method of manufacturing a display substrate according to an exemplary embodiment of the present invention.
Figure 9B:
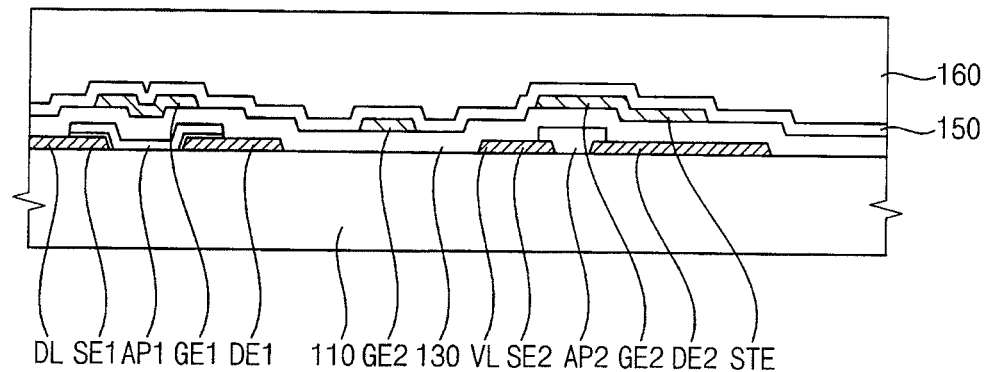

FIGS. 9A and 9B are cross-sectional views illustrating a method of manufacturing a display substrate according to an exemplary embodiment of the present invention.

Referring to FIG. 9A, a first conductive layer may be formed on the base substrate 110, and the first conductive layer may be patterned by a photolithography process to form a first conductive pattern including the switching input electrode SE1, the switching output electrode DE1, the driving input electrode SE2 and the driving output electrode DE2.

The switching active pattern AP1 may be formed on the base substrate 110 having the first conductive pattern to overlap each of the switching input electrode SE1 and the switching output electrode DE1. The switching active pattern AP1 may comprise, for example, amorphous silicon. The driving active pattern AP2 may be formed on the base substrate 110 having the switching active pattern AP1 to overlap each of the driving input electrode SE2 and the driving output electrode DE2. The driving active pattern AP2 may comprise, for example, a metal oxide. In an exemplary embodiment, the switching active pattern AP1 may be formed on the base substrate 110 having the driving active pattern AP2.

The first insulation layer 130 may be formed on the base substrate 110 having the switching active pattern AP1 and the driving active pattern AP2.

Referring to FIG. 9B, a second conductive layer may be formed on the base substrate 110 having the first insulation layer, and the second conductive layer may be patterned to form a second conductive pattern including the switching control electrode GE1, the driving control electrode GE2 and a storage electrode STE.

The second insulation layer 150 and the third insulation layer 160 may be formed on the base substrate 110 having the second conductive pattern.

The first, second and third insulation layers 130, 150 and 160 formed on the switching output electrode DE1 may be removed to form a fifth hole H5. The second and third insulation layers 150 and 160 formed on the driving control electrode GE2 may be removed to form a sixth hole H6. The first, second and third insulation layers 130, 150 and 160 formed on the driving output electrode DE2 may be removed to form a seventh hole H7. A predetermined thickness of the third insulation layer 160 formed on the storage electrode STE may be removed to form an eighth hole H8. The predetermined thickness may be determined based on the electrical capacity of a storage capacitor (Cst).

A third conductive layer may be formed on the base substrate 110 having the fifth, sixth, seventh and eighth holes H5, H6, H7 and H8. The third conductive layer may be patterned to form the first connection electrode CE1 and the anode AN. The first connection electrode CE1 may be connected to the switching output electrode DE1 through the fifth hole H5. The first connection electrode CE1 may contact the driving control electrode GE2 through the sixth hole H6. Thus, the switching transistor Qs may electrically be connected to the driving transistor Qd through the first connection electrode CE1. The anode AN may be connected to the driving output electrode DE2 through the seventh hole H7.

In an exemplary embodiment, processes of forming the insulation wall WA, the light-emitting layer EL and the cathode CA on the base substrate 110 having the anode AN are substantially the same as the processes of forming the insulation wall WA, the light-emitting layer EL and the cathode CA according to an exemplary embodiment described above in connection with FIGS. 4A-4G.

Referring to FIGS. 8 and 9, the switching active pattern AP1 may be formed on the switching input electrode SE1 and the switching output electrode DE1, and the driving active pattern AP2 may be formed on the driving input electrode SE2 and the driving output electrode DE2. In an exemplary embodiment, the switching active pattern AP1 may be formed on the base substrate 110, and the switching input electrode SE1 and the switching output electrode DE1 may be formed on the base substrate 110 having the switching active pattern AP1. The driving input electrode SE2 and the driving output electrode DE2 may be formed on the base substrate 110 having the driving active pattern AP2.

According to an exemplary embodiment, the switching transistor Qs and the driving transistor Qd include active patterns comprising the amorphous silicon and metal oxide, respectively. Thus, electrical characteristics of the switching transistor Qs and the driving transistor Qd may be improved. Thus, the display substrate 102 may have a high resolution and the screen size of the display apparatus may be increased. In an exemplary embodiment, the switching control electrode GE1 and the driving control electrode GE2 may be formed by patterning the first conductive layer. The switching and driving input electrodes SE1 and SE2 and the switching and driving output electrodes DE1 and DE2 may be formed by patterning the second conductive layer. Thus, a process of manufacturing the display substrate may be simplified.

Figure 10:
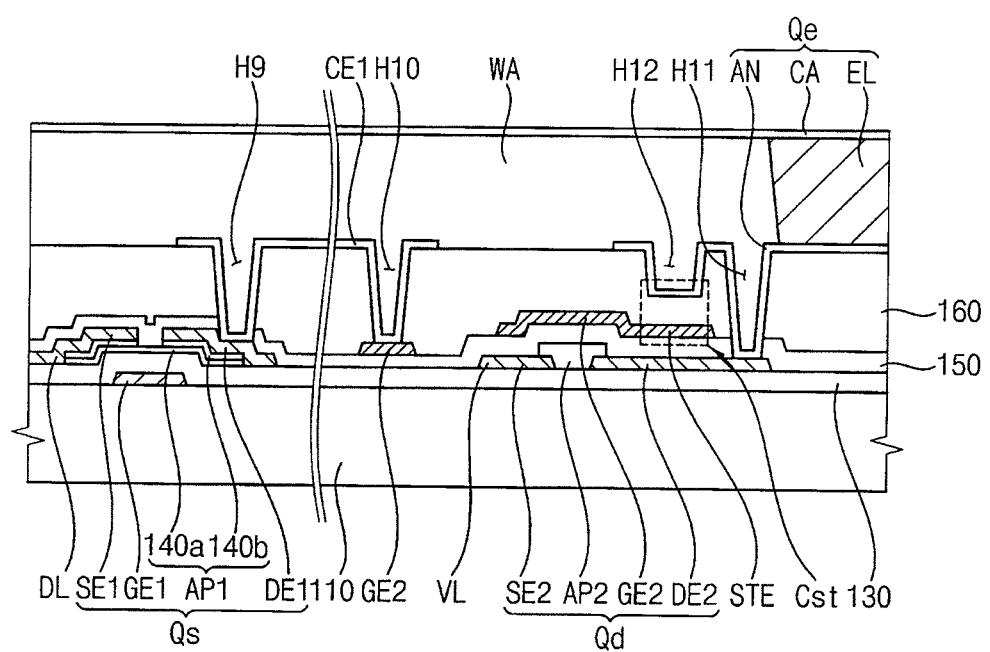
FIG. 10 is a cross-sectional view illustrating a display substrate according to an exemplary embodiment of the present invention.

FIG. 10 is a cross-sectional view illustrating a display substrate according to an exemplary embodiment of the present invention.

A display substrate 104 in FIG. 10 is substantially the same as the display substrate 101 except for a structure of layers of the display substrate 104.

Referring to FIG. 10, the display substrate 104 includes the switching transistor Qs, the driving transistor Qd and the light-emitting element Qe.

The switching transistor Qs may include the switching control electrode GE1, the switching active pattern AP1 formed on the switching control electrode GE1, the switching input electrode SE1, and the switching output electrode DE1 which are formed on the switching active pattern AP1. The switching output electrode DE1 may be exposed by a ninth hole H9 formed through the second insulation layer 150 and the third insulation layer 160.

The driving transistor Qd may include the driving input electrode SE2 and driving output electrode DE2 which are formed on the first insulation layer 130, a driving active pattern AP2 formed on the driving input electrode SE2 and the driving output electrode DE2, and a driving control electrode GE2 formed on the driving active pattern AP2. The driving control electrode GE2 may be exposed by a tenth hole H10 formed through the third insulation layer 160. The driving output electrode DE2 may be exposed by a eleventh hole H11 formed through the second insulation layer 150 and the third insulation layer 160. The driving output electrode DE2 may be electrically connected to the light-emitting element Qe through the eleventh hole H11.

The switching output electrode DE1 and the driving control electrode GE2 may be connected to the first connection electrode CE1 through the ninth hole H9 and the tenth hole H10. Thus, the switching transistor Qs may be electrically connected to the driving transistor Qd.

The third insulation layer 160 may include a twelfth hole H12 from which a predetermined thickness of the third insulation layer 160 has been removed. The twelfth hole H12 corresponds to the storage electrode STE connected to the driving control electrode GE2. The predetermined thickness may be determined based on the electrical capacity of the storage capacitor (Cst).

FIGS. 11A to 11E are cross-sectional views illustrating a method of manufacturing a display substrate according to an exemplary embodiment of the present invention.

Figure 11A:
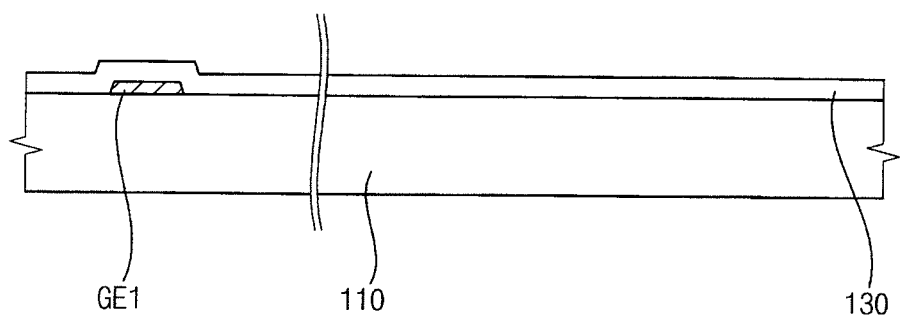
FIGS. 11A to 11E are cross-sectional views illustrating a method of manufacturing a display substrate according to an exemplary embodiment of the present invention.
Figure 11B:
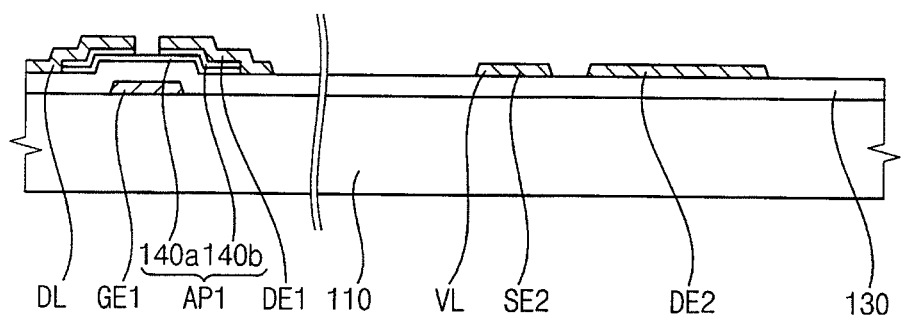

Referring to FIG. 11A, a first conductive layer may be formed on the base substrate 110, and the first conductive layer may be patterned to form a first conductive pattern including the switching control electrode GE1.

The first insulation layer 130 may be formed on the base substrate 110 having the first conductive pattern.

Referring to FIG. 1B, the switching active pattern AP1 may be formed on the first insulation layer 130. The switching active pattern AP may comprise, for example, amorphous silicon.

A second conductive layer may be formed on the base substrate 110 having the switching active pattern AP1, and the second conductive layer may be patterned to form a second conductive pattern including the switching input electrode SE1, the switching output electrode DE1, a driving voltage line VL, the driving input electrode SE2 and the driving output electrode DE2.

Figure 11C:
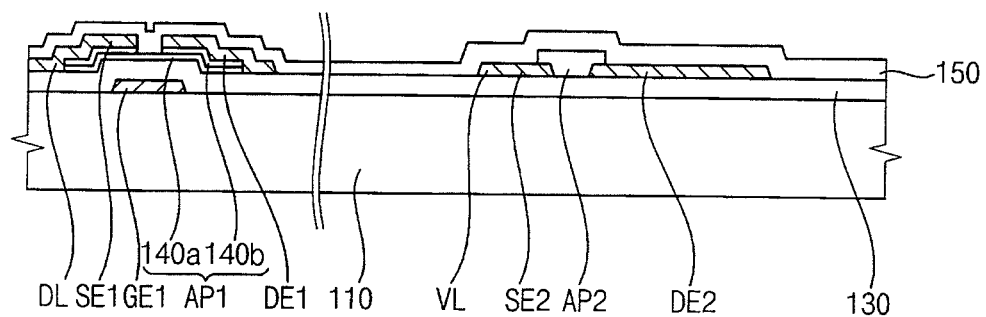

Referring to FIG. 11C, the driving active pattern AP2 may be formed on the base substrate 110 having the second conductive pattern. The driving active pattern AP2 may comprise, for example, a metal oxide.

The second insulation layer 150 may be formed on the base substrate 110 having the driving active pattern AP2.

Figure 11D:
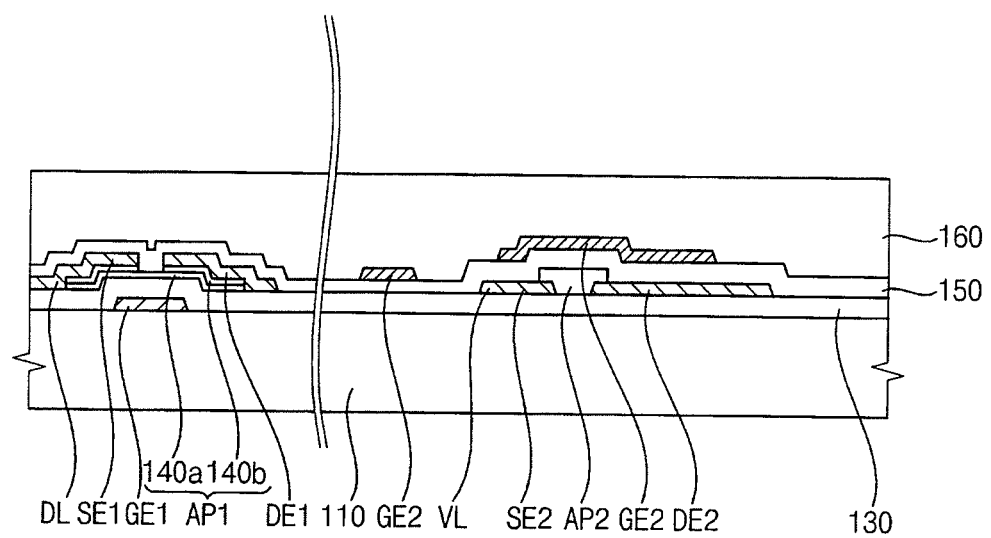

Referring to FIG. 11D, a third conductive layer may be formed on the base substrate 110 having the second insulation layer 150, and the third conductive layer may be patterned to form a third conductive pattern including the driving control electrode GE2 and the storage electrode STE.

The third insulation layer 160 may be formed on the base substrate 110 having the third conductive pattern. The second insulation layer 150 and the third insulation layer 160 may be patterned to form the ninth, tenth, eleventh and twelfth holes H9, H10, H11 and H12.

Figure 11E:
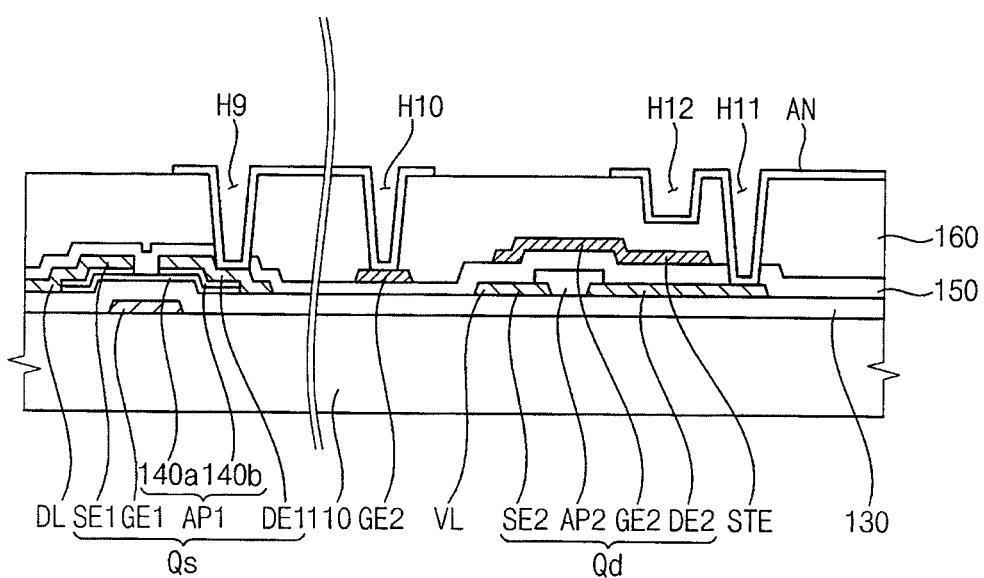

Referring to FIG. 11E, a fourth conductive layer may be formed on the base substrate 110 having the ninth, tenth, eleventh and twelfth holes H9, H10, H11 and H12, and the fourth conductive layer may be patterned to form the first connection electrode CE1 and the anode AN.

In an exemplary embodiment, processes of forming the insulation wall WA, the light-emitting layer EL and the cathode CA on the base substrate 110 having the anode AN are substantially the same as the processes of forming the insulation wall WA, the light-emitting layer EL and the cathode CA described in connection with FIGS. 4A-4G.

According to an exemplary embodiment, the switching transistor Qs and the driving transistor Qd include active patterns comprising the amorphous silicon and metal oxide, respectively. Thus, electrical characteristics of the switching transistor Qs and the driving transistor Qd may be improved. Thus, the display substrate 104 may have a high resolution and the screen size of the display apparatus may be increased. In an exemplary embodiment, the switching control electrode GE1 is formed under the switching active pattern AP1 to prevent the leakage current from being generated by sensing external light in the switching active pattern AP1. In an exemplary embodiment, the driving active pattern AP2 is formed on the driving input electrode SE2 and the driving output electrode DE2 to prevent damage to the driving active pattern AP2.

Figure 12:
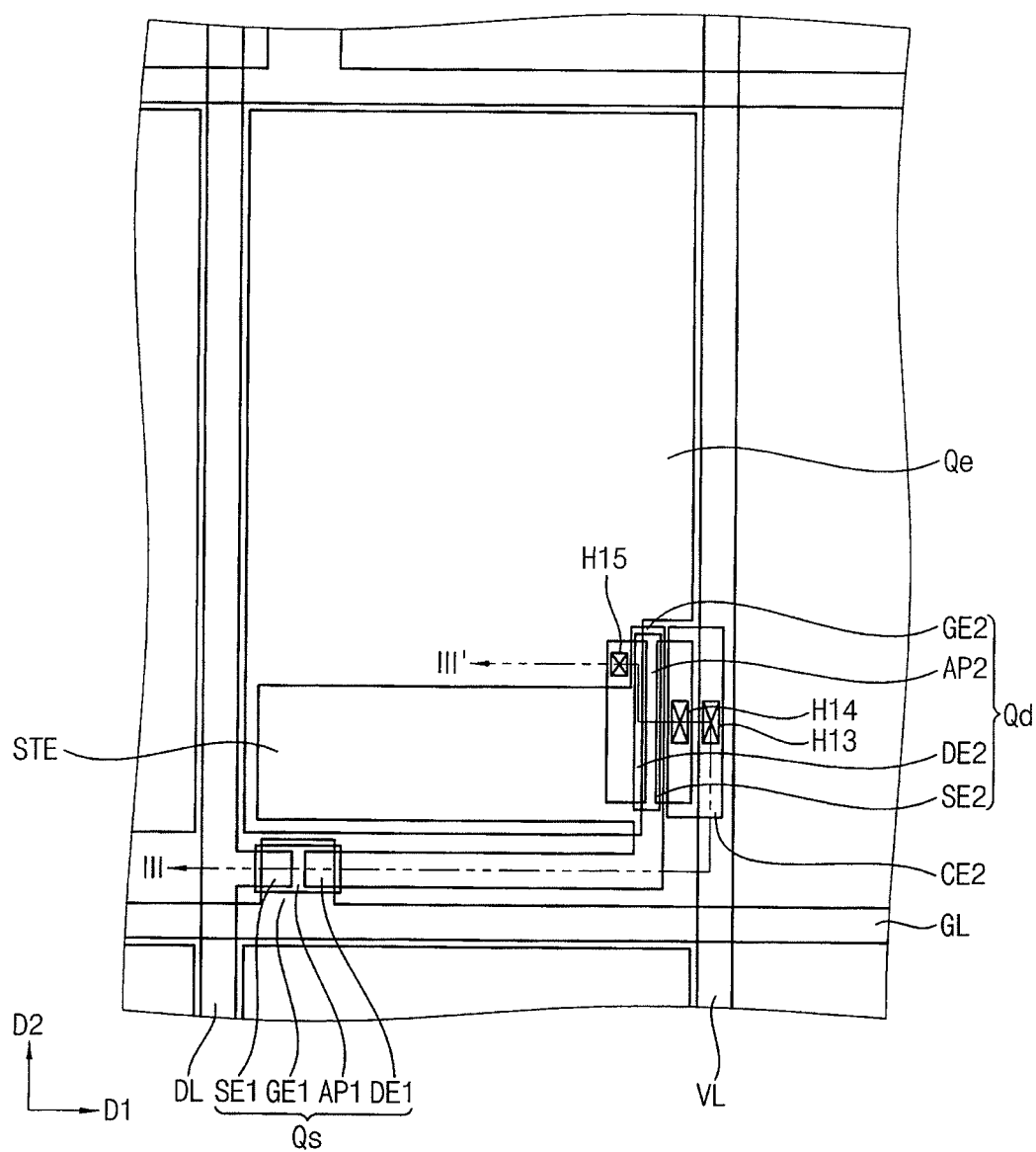
FIG. 12 is a plan view illustrating a display substrate according to an exemplary embodiment of the present invention.
Figure 13:
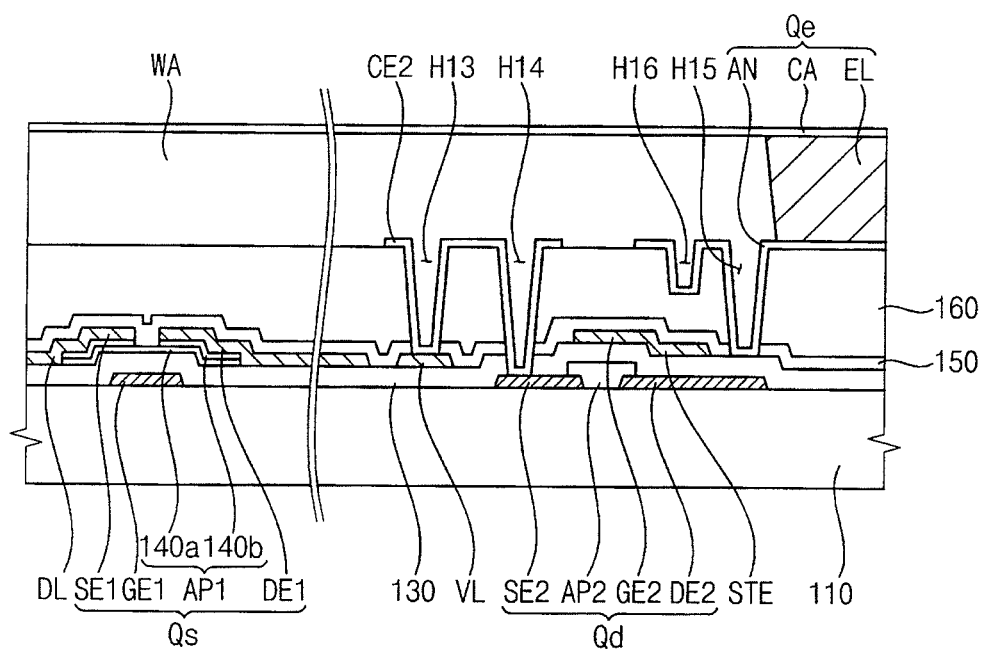
FIG. 13 is a cross-sectional view taken along the line III-III' shown in FIG. 12 according to an exemplary embodiment of the present invention.

FIG. 12 is a plan view illustrating a display substrate according to an exemplary embodiment of the present invention. FIG. 13 is a cross-sectional view taken along the line III-III' shown in FIG. 12 according to an exemplary embodiment of the present invention.

A display substrate 105 in FIGS. 12 and 13 is substantially the same as the display substrate 101 except for the driving transistor Qd, the driving voltage line VL and the second connection electrode CE2.

Referring to FIGS. 12 and 13, the display substrate 105 includes the switching transistor Qs, the driving transistor Qd and the light-emitting element Qe.

The switching output electrode DE1 of the switching transistor Qs may be electrically and physically connected to the driving control electrode GE2 of the driving transistor Qd. An edge portion of the switching output electrode DE1 may extend to the driving control electrode GE2. Thus, the switching output electrode DE1 may be electrically connected to the driving control electrode GE2 without an additional connection member.

The driving transistor Qd may include the driving input electrode SE2, the driving output electrode DE2 and the driving active pattern AP2 which are formed under the driving control electrode GE2. The driving active pattern AP2 may comprise, for example, a metal oxide.

The driving input electrode SE2 may be electrically connected to the driving voltage line VL through the second connection electrode CE2. The second connection electrode CE2 may be connected to the driving voltage line VL through a thirteenth hole H13 formed in the second insulation layer 150 and the third insulation layer 160. The driving voltage line VL is exposed by the thirteenth hole H13. The second connection electrode CE2 may be connected to the driving input electrode SE2 through fourteenth hole H14 formed through the second insulation layer 150 and the third insulation layer 160. The driving input electrode SE2 is exposed by the fourteenth hole H14.

Figure 14A:
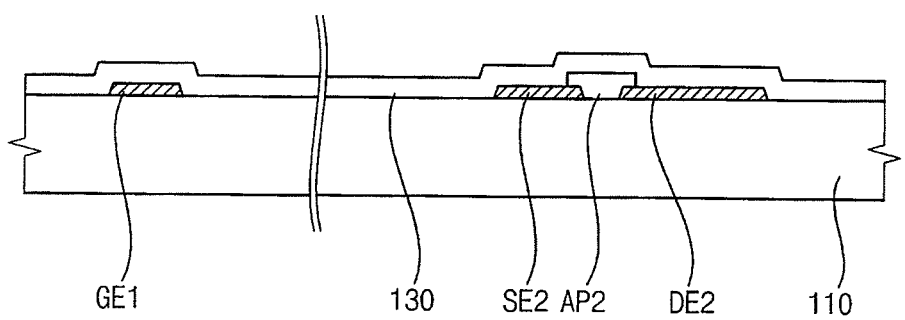
FIGS. 14A, 14C and 14D are cross-sectional views illustrating a method of manufacturing a display substrate according to an exemplary embodiment of the present invention.
Figure 14B:
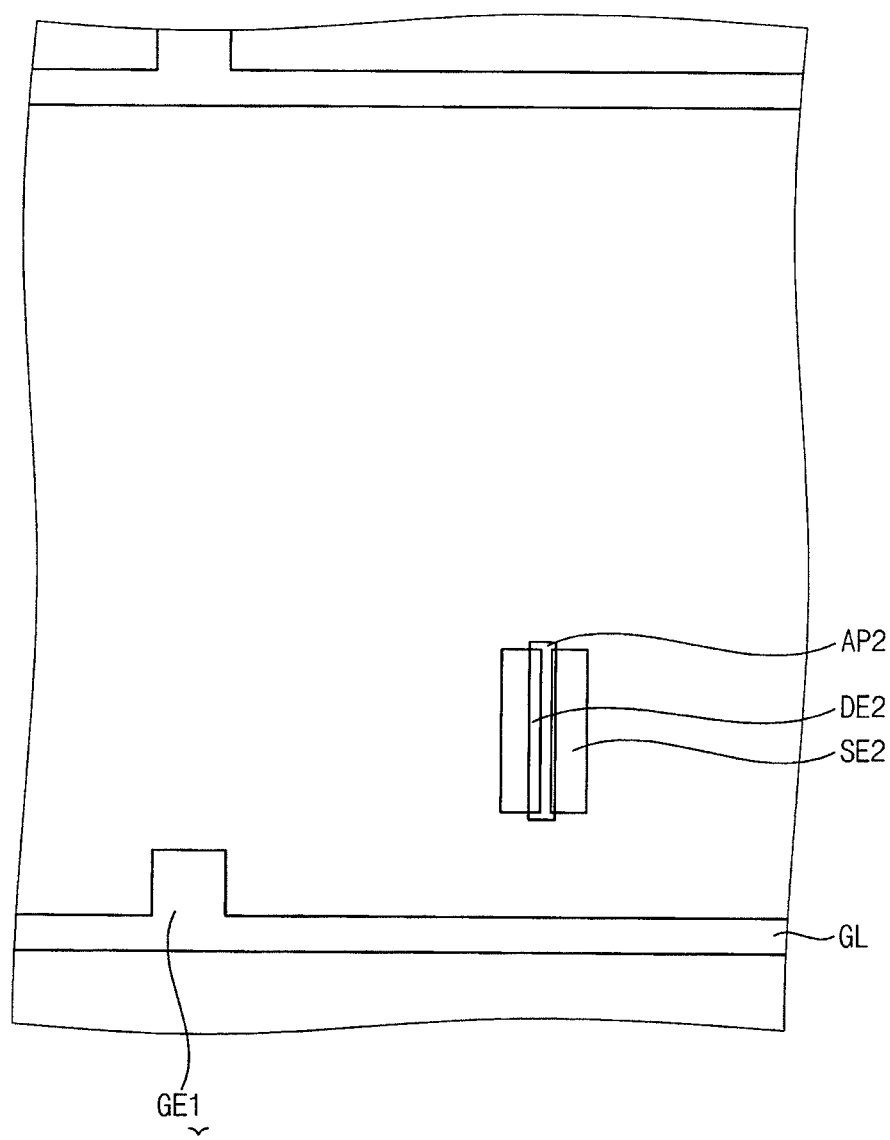
FIGS. 14B and 14E are plan views illustrating a method of manufacturing a display substrate according to an exemplary embodiment of the present invention.
Figure 14C:
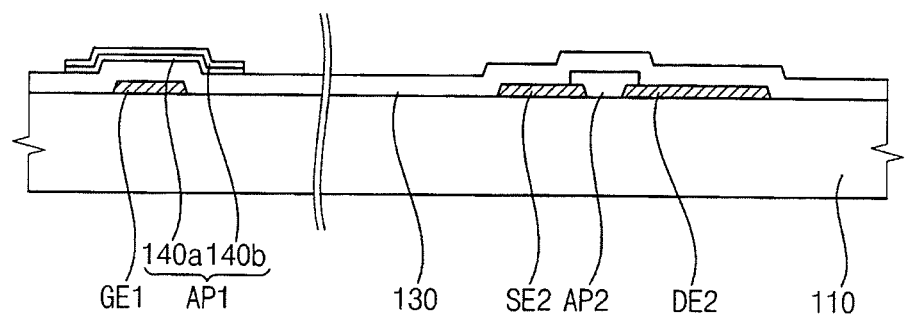
Figure 14D:
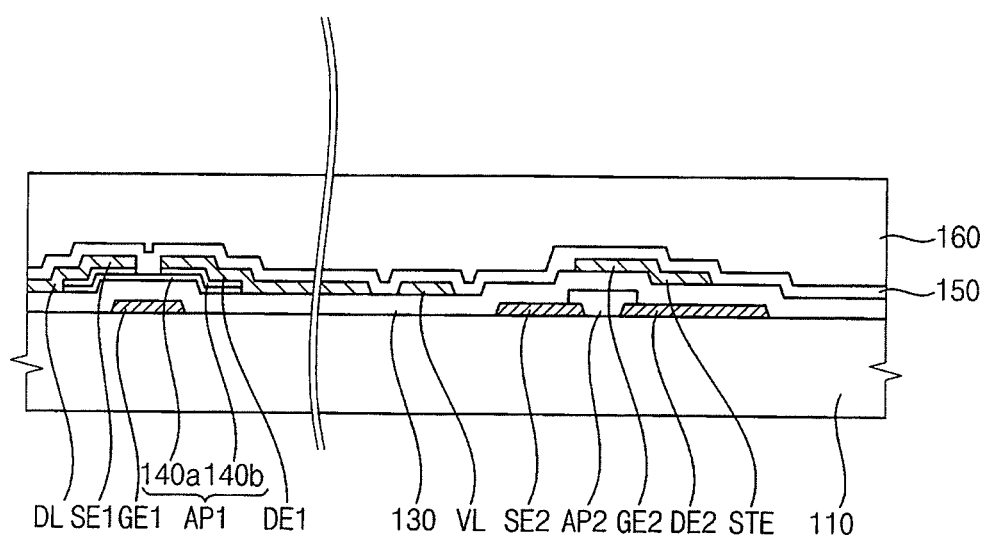
Figure 14E:
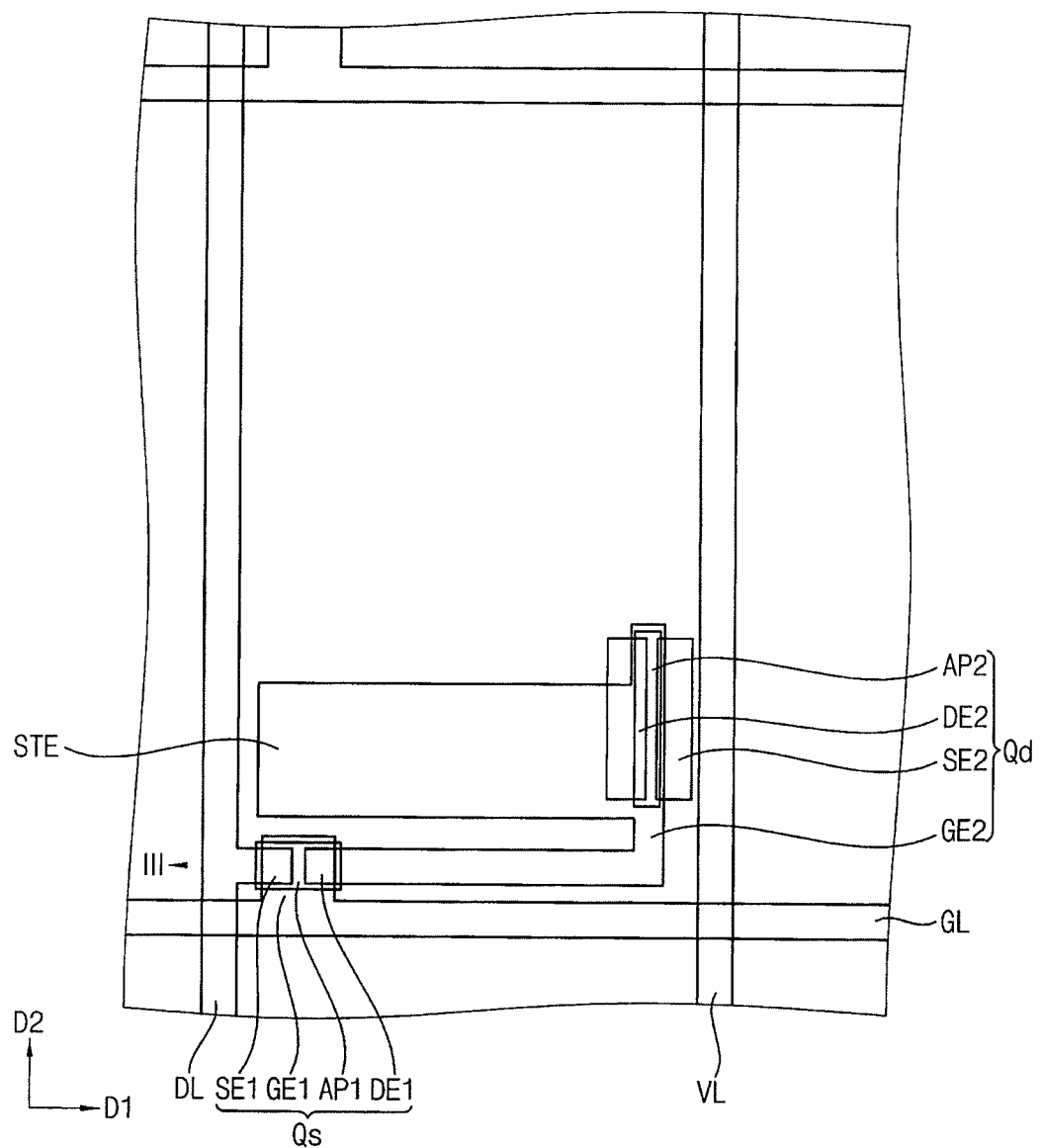

FIGS. 14A, 14C and 14D are cross-sectional views and FIGS. 14B and 14E are plan views illustrating a method of manufacturing a display substrate according to an exemplary embodiment of the present invention.

FIG. 14A is a cross-sectional view illustrating a process for forming the switching control electrode, a driving input electrode, a driving output electrode and a driving active pattern according to an exemplary embodiment of the present invention. FIG. 14B is a plan view of FIG. 14A.

Referring to FIGS. 14A and 14B, a first conductive layer may be formed on the base substrate 110, and the first conductive layer may be patterned to form a first conductive pattern including the gate line GL, the switching control electrode GE1, the driving input electrode SE1 and the driving output electrode DE1.

The driving active pattern AP2 may be formed on the base substrate 110 having the first conductive pattern. The driving active pattern AP2 may comprise a metal oxide. The driving active pattern AP2 may be formed by a sputtering process or MOCVD process.

The first insulation layer 130 may be formed on the base substrate 110 having the driving active pattern AP2.

Referring to FIG. 14C, the switching active pattern AP1 may be formed on the base substrate 110 having the first insulation layer 130. The switching active pattern AP1 may comprise, for example, amorphous silicon. The switching active pattern AP1 may be formed on the switching control electrode GE1. The switching active pattern AP1 may be formed by a PECVD process using amorphous silicon on the first insulation layer 130.

For example, the switching active pattern AP1 may include the amorphous silicon layer 140a formed on the first insulation layer 130 and the ohmic contact layer 140b formed on the amorphous silicon layer 140a. The ohmic contact layer 140b may include amorphous silicon through which n$^+$ impurities are implanted at a high concentration (n+ a-Si).

FIG. 14D is a cross-sectional view illustrating a process of forming the switching input electrode, the switching output electrode and the driving control electrode according to an exemplary embodiment of the present invention. FIG. 14E is a plan view of FIG. 14D.

Referring to FIGS. 14D and 14E, a second conductive layer may be formed on the base substrate 110 having the switching active pattern AP1. The second conductive layer may be patterned to form a second conductive pattern including the switching input electrode SE1, the switching output electrode DE1, the driving control electrode GE2, the storage electrode STE and the driving voltage line VL. The driving voltage line VL may be spaced apart from the driving control electrode GE2.

The second insulation layer 150 and the third insulation layer 160 may be formed on the base substrate 110 having the second conductive pattern.

The second insulation layer 150 and the third insulation layer 160 formed on the driving voltage line VL may be removed to form the thirteenth hole H13. The first, second and third insulation layers 130, 150 and 160 formed on the driving input electrode SE2 may be removed to form the fourteenth hole H14. The first, second and third insulation layers 130, 150 and 160 formed on the driving output electrode DE2 may be removed to form a fifteenth hole H15. A portion of the third insulation layer 160 formed on the storage electrode STE may be removed to form a sixteenth hole H16.

A third conductive layer may be formed on the base substrate 110 having the thirteenth, fourteenth, fifteenth and sixteenth holes H13, H14, H15 and H16. The third conductive layer may be patterned to form the second connection electrode CE2 and the anode AN. The second connection electrode CE2 may be connected to the driving voltage line VL through the thirteenth hole H13 and connected to the driving control electrode GE2 through the fourteenth hole H14. The anode AN may be connected to the driving output electrode DE2 through the fifteenth hole H15.

In an exemplary embodiment, processes of forming the insulation wall WA, the light-emitting layer EL and the cathode CA on the base substrate 110 having the anode AN are substantially the same as the processes of forming the insulation wall WA, the light-emitting layer EL and the cathode CA described in connection with FIGS. 4A-4G.

According to an exemplary embodiment, the switching transistor Qs and the driving transistor Qd include active patterns comprising the amorphous silicon and metal oxide, respectively. Thus, electrical characteristics of the switching transistor Qs and the driving transistor Qd may be improved. Thus, the display substrate 104 may have a high resolution and the screen size of the display apparatus may be increased. In an exemplary embodiment, the switching control electrode GE1 is formed under the switching active pattern AP1 to prevent the leakage current from being generated by sensing external light in the switching active pattern AP1. In an exemplary embodiment, the driving active pattern AP2 is formed on the driving input electrode SE2 and the driving output electrode DE2 to prevent damage to the driving active pattern AP2. In an exemplary embodiment, the switching control electrode GE1 and the driving control electrode GE2 may be formed by patterning the first conductive layer. The switching and driving input electrodes SE1 and SE2 and the switching and driving output electrodes DE1 and DE2 may be formed by patterning the second conductive layer. Thus, a process of manufacturing the display substrate may be simplified.

Figure 15:
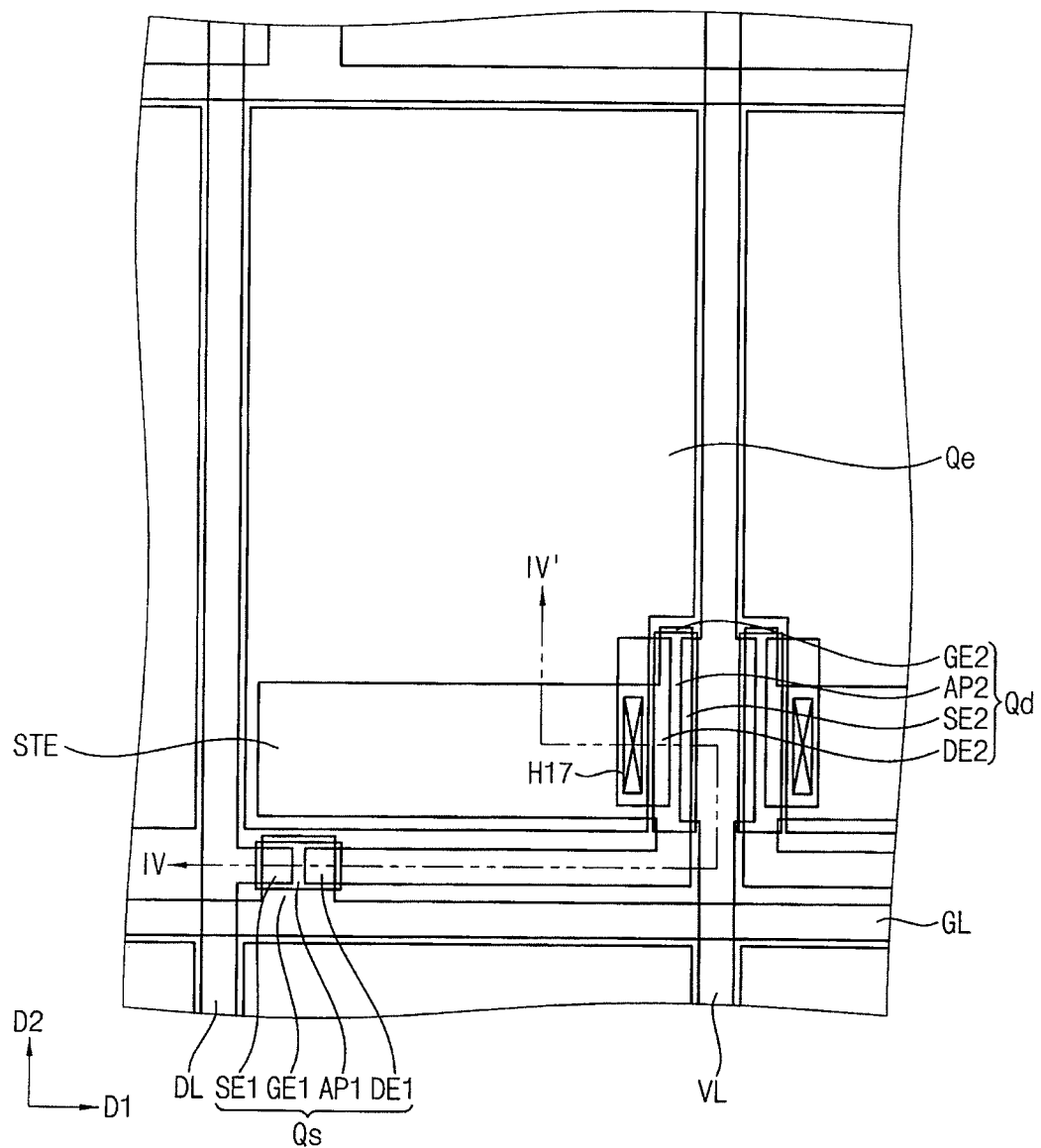
FIG. 15 is a plan view illustrating a display substrate according to an exemplary embodiment of the present invention.
Figure 16:
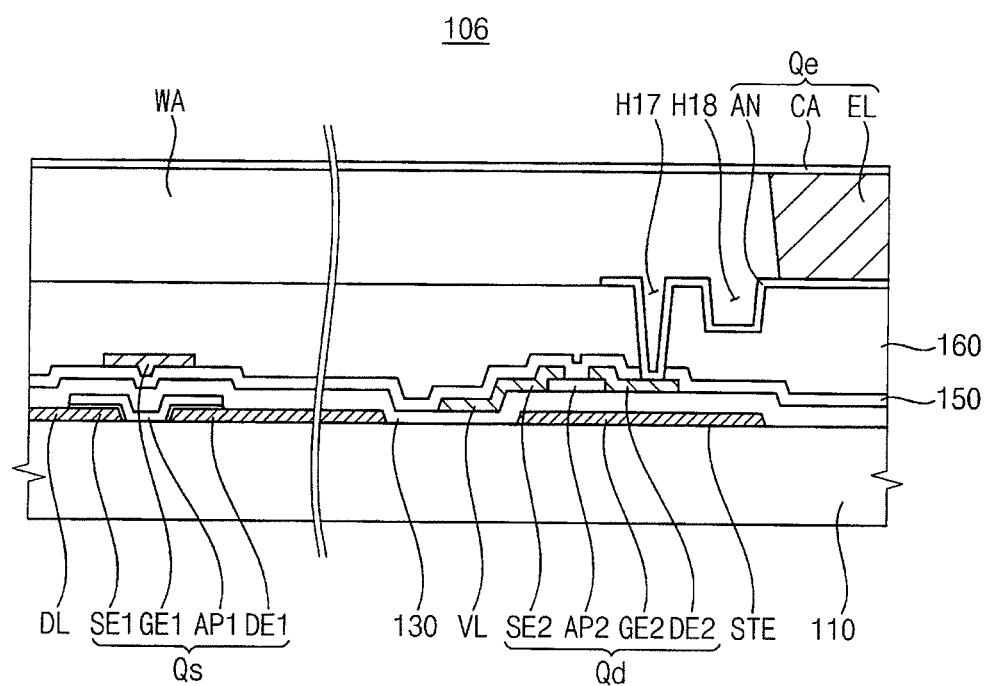
FIG. 16 is a cross-sectional view taken along the line IV-IV' shown in FIG. 15 according to an exemplary embodiment of the present invention.

FIG. 15 is a plan view illustrating a display substrate according to an exemplary embodiment of the present invention. FIG. 16 is a cross-sectional view taken along the line IV-IV' shown in FIG. 15 according to an exemplary embodiment of the present invention.

A display substrate 106 in FIGS. 15 and 16 is substantially the same as the display substrate 101 except for the switching transistor Qs.

Referring to FIGS. 15 and 16, the display substrate 106 includes the switching transistor Qs, the driving transistor Qd and the light-emitting element Qe.

The switching transistor Qs may include the switching input electrode SE1, the switching output electrode DE1 spaced apart from the switching input electrode SE1, the switching active pattern AP1 formed on the switching input electrode SE1 and the switching output electrode DE1, and the switching control electrode GE1 formed on the switching active pattern AP1. The switching active pattern AP1 may comprise, for example, amorphous silicon.

The driving transistor Qd may include the driving control electrode GE2, the driving active pattern AP2 formed on the driving control electrode GE2, the driving input electrode SE2 and the driving output electrode DE2 which are formed on the driving active pattern AP2. The driving active pattern AP2 may comprise, for example, a metal oxide.

The switching output electrode DE1 may be electrically and physically connected to the driving control electrode GE without an additional connection member. An edge portion of the switching output electrode DE1 may extend to the driving control electrode GE2.

The driving output electrode DE2 may be exposed by a seventeenth hole H17 formed through the second insulation layer 150 and the third insulation layer 160. The driving output electrode DE2 may be connected to the anode AN through the seventeenth hole H17.

FIGS. 17A to 17E are cross-sectional views illustrating a method of manufacturing a display substrate according to an exemplary embodiment of the present invention.

Figure 17A:
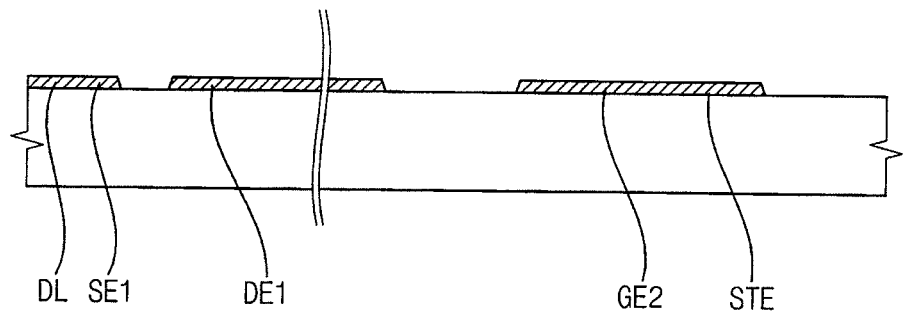
FIGS. 17A to 17E are cross-sectional views illustrating a method of manufacturing a display substrate according to an exemplary embodiment of the present invention.

Referring to FIG. 17A, a first conductive layer may be formed on the base substrate 110, and the first conductive layer may be patterned to form a first conductive pattern including the data line DL, the switching input electrode SE1, the switching output electrode DE1, the driving control electrode GE2 and the storage electrode STE. The switching output electrode DE1 may be connected to the driving control electrode GE2.

Figure 17B:
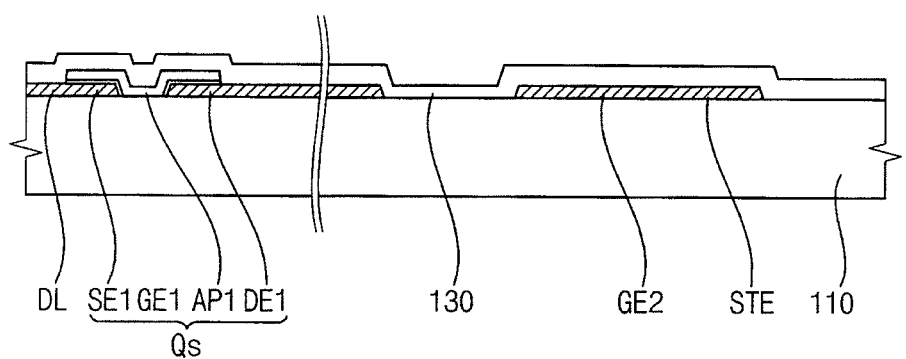

Referring to FIG. 17B, the switching active pattern AP1 may be formed on the base substrate 110 having the first conductive pattern.

The switching active pattern AP1 may be formed between the switching input electrode SE1 and the switching output electrode DE1. The switching active pattern AP1 may be formed by patterning the amorphous silicon layer 140a and the ohmic contact layer 140b using a photolithography process.

The first insulation layer 130 may be formed on the base substrate 110 having the switching active pattern AP1.

Figure 17C:
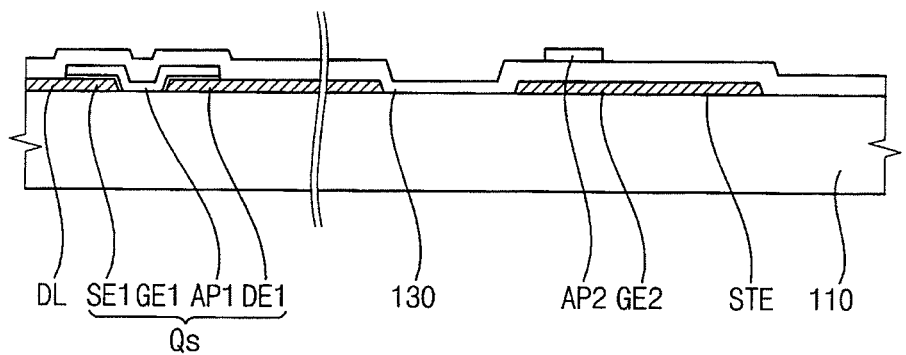

Referring to FIG. 17C, the driving active pattern AP2 may be formed on the base substrate 110 having the first insulation layer 130. The driving active pattern AP2 may comprise, for example, a metal oxide. The driving active pattern AP1 may be formed by patterning a metal oxide layer using a photolithography process.

Figure 17D:
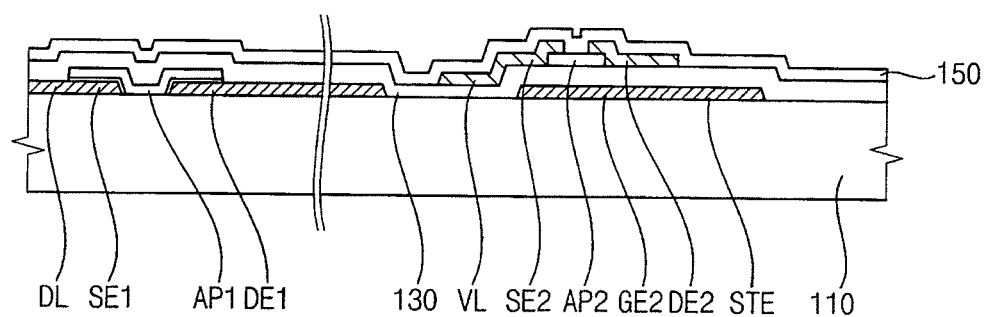

Referring to FIG. 17D, a second conductive layer may be formed on the base substrate 110 having the driving active pattern AP2, and the second conductive layer may be patterned to for a second conductive pattern including the driving voltage line VL, the driving input electrode SE2 and the driving output electrode DE2.

The second insulation layer 150 may be formed on the base substrate 110 having the second conductive pattern.

Figure 17E:
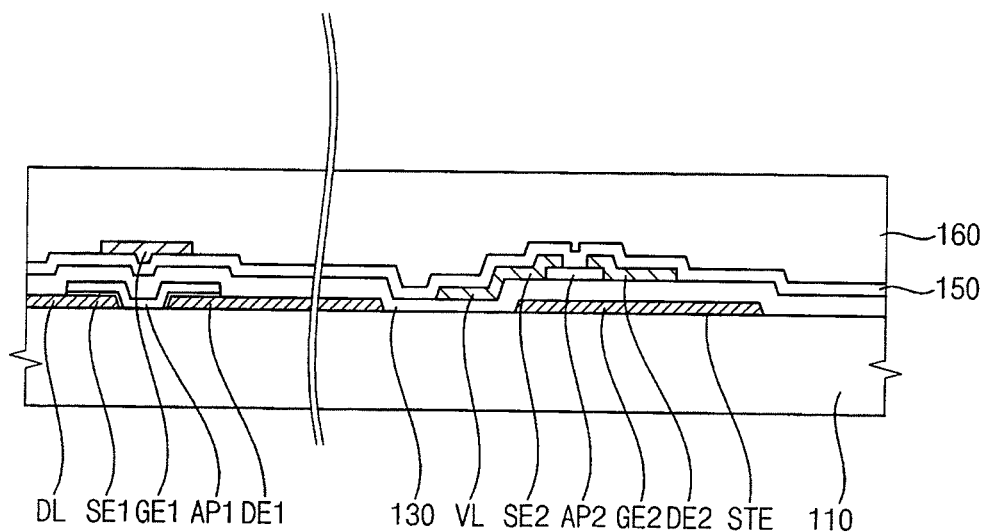

Referring to FIG. 17E, a third conductive layer may be formed on the base substrate 110 having the second insulation layer 150, and the third conductive layer may be patterned to form a third conductive pattern including the switching control electrode GE1.

The third insulation layer 160 may be formed on the base substrate 110 having the third conductive pattern. The third insulation layer 160 formed on the driving output electrode DE2 may be removed to form the seventeenth hole H17. The third insulation layer 160 formed on the storage electrode STE may be removed to form an eighteenth hole H18. The eighteenth hole H18 may be formed by removing a portion of the third insulation layer 160 and the portion can be determined by the electrical capacity of the storage capacitor (Cst).

A fourth conductive layer may be formed on the base substrate 110 having the seventeenth hole H17 and the eighteenth hole H18. The fourth conductive layer may be patterned to form the anode AN.

Processes of forming the insulation wall WA, the light-emitting layer EL and the cathode CA on the base substrate 110 having the anode AN are substantially the same as the processes of forming the insulation wall WA, the light-emitting layer EL and the cathode CA described in connection with FIGS. 4A-4G.

According to an exemplary embodiment, the switching transistor Qs and the driving transistor Qd include active patterns comprising the amorphous silicon and metal oxide, respectively. Thus, electrical characteristics of the switching transistor Qs and the driving transistor Qd may be improved. Thus, the display substrate 106 may have a high resolution and the screen size of the display apparatus may be increased.

Figure 18:
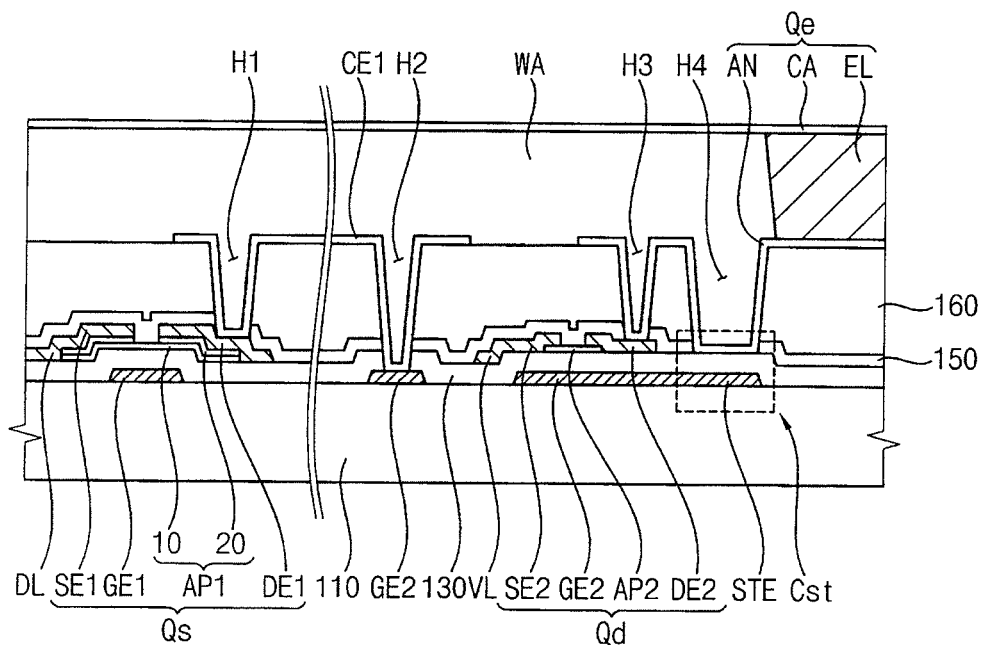
FIG. 18 is a cross-sectional view illustrating a display substrate according to an exemplary embodiment of present invention.

FIG. 18 is a cross-sectional view illustrating a display substrate according to an exemplary embodiment of the present invention.

A circuit diagram and a plan view of FIG. 18 are substantially the same as those of FIGS. 1 and 2. A display substrate 107 is substantially the same as the display substrate 101 except for the switching and driving patterns AP1 and AP2. Referring to FIG. 18, the display substrate 107 includes the plurality of signal lines GL, DL and VL and the plurality of pixel units connected to the signal lines GL, DL and VL. The pixel units may be arranged in substantially a matrix. The signal lines GL, DL and VL may include the gate line GL, the data line DL and the driving voltage line VL. Each of the pixel units may include the switching transistor Qs, the driving transistor Qd, the light-emitting element Qe and the storage capacitor Cst.

The switching transistor Qs may include the switching active pattern AP1. The switching active pattern AP1 may include a first pattern 10 and a second pattern 20. The first pattern 10 may comprise a metal oxide, and the second pattern 20 may comprise amorphous silicon. The switching active pattern AP1 may further include an ohmic contact pattern. The driving transistor Qd may comprise a metal oxide.

FIGS. 19A to 19F are cross-sectional views illustrating a method of manufacturing a display substrate according to an exemplary embodiment of the present invention.

Figure 19A:
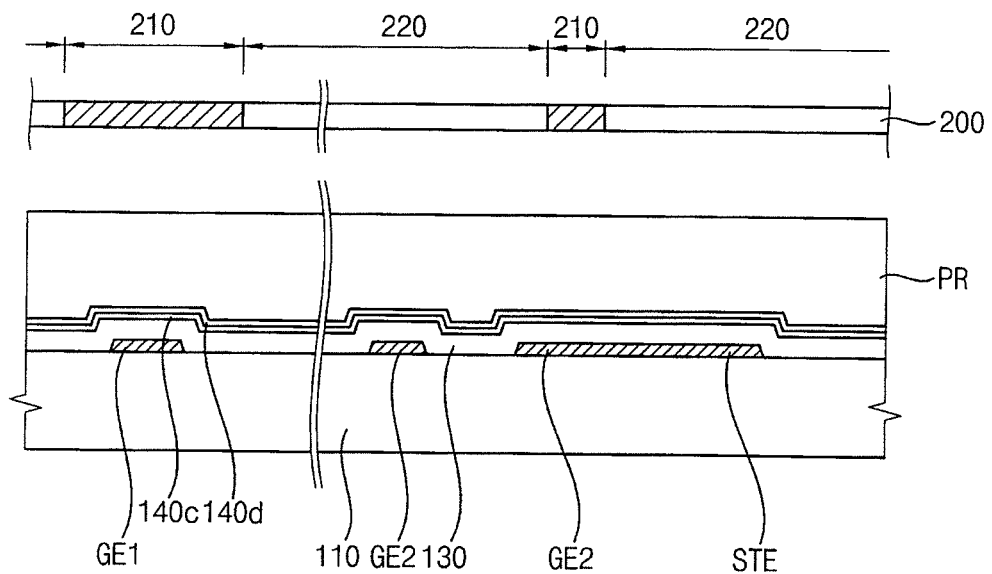
FIGS. 19A to 19F are cross-sectional views illustrating a method of manufacturing a display substrate according to an exemplary embodiment of the present invention.

Referring to FIG. 19A, a gate pattern may be formed on the base substrate 110. The gate pattern may include the switching control electrode GE1, the first driving control electrode GE2, the gate line GL and the storage electrode STE. A first conductive layer may be formed on the base substrate 110. The first conductive layer may be patterned to form the gate pattern by a photolithography process.

A gate insulation layer 130, a metal oxide layer 140c and an amorphous silicon layer 140d may be formed on the base substrate 110 including the gate pattern. The metal oxide layer 140c may comprise, for example, the metal oxide. The metal oxide layer 140c may be formed by, for example, sputtering the metal oxide. In an exemplary embodiment, the metal oxide layer 140c may be formed by MOCVD. The amorphous silicon layer 140d may comprise, for example, amorphous silicon. The amorphous silicon layer 140d may be formed by PECVD.

A first photoresist layer PR may be formed on the base substrate 110 including the gate insulation layer 130, the metal oxide layer 140c and the amorphous silicon layer 140d. A first mask 200 may be disposed over the base substrate 110 including the first photoresist layer PR.

In an exemplary embodiment, the first photoresist layer PR may include a positive photoresist composition. The first mask 200 may include a light-blocking part 210 and a light-transmitting part 220. The light-blocking part 210 may correspond to the switching control electrode GE1 and the first driving control electrode GE2. The light-transmitting part 220 may correspond to a remaining region excluding the switching control electrode GE1 and the first driving control electrode GE2.

Figure 19B:
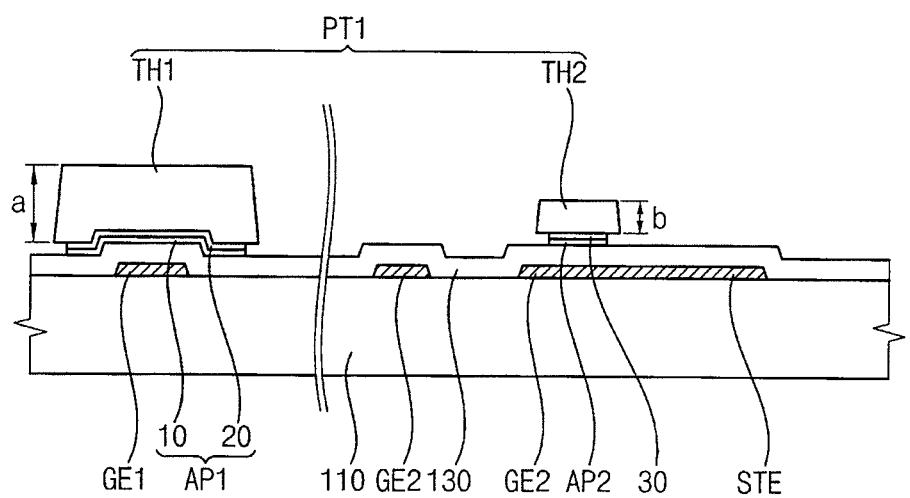

Referring to FIG. 19B, light may be projected onto the first photoresist layer PR through the first mask 200. The first photoresist layer PR may be developed to form a first photoresist pattern PT1. The amorphous silicon layer 140d and the metal oxide layer 140c may be patterned using the first photoresist pattern PT1 which serves as an etching blocking layer. The amorphous silicon layer 140d and the metal oxide layer 140c may be patterned to form the switching active pattern AP1, the driving active pattern AP2 and a third pattern 30. The switching active pattern AP1 may include the first and second patterns 10 and 20. The third pattern 30 may be formed on the driving active pattern AP2.

The first photoresist pattern PT1 may include a first thickness portion TH1 having a first thickness "a" and a second thickness portion TH2 having a second thickness "b." The second thickness "b" may be smaller than the first thickness "a." The first thickness portion TH1 may be formed on the insulation layer 120 of a region corresponding to the switching control electrode GE1. The second thickness portion TH2 may be formed on the insulation layer 120 of a region corresponding to the first driving control electrode GE2.

The amorphous silicon layer 140d and the metal oxide layer 140c may be patterned by a photolithography process. Thus, the first and second patterns 10 and 20 of the switching active pattern AP1 may be formed on the switching control electrode GE1. The driving active pattern AP2 and the third pattern 30 may be formed on the first driving control electrode GE2.

Figure 19C:
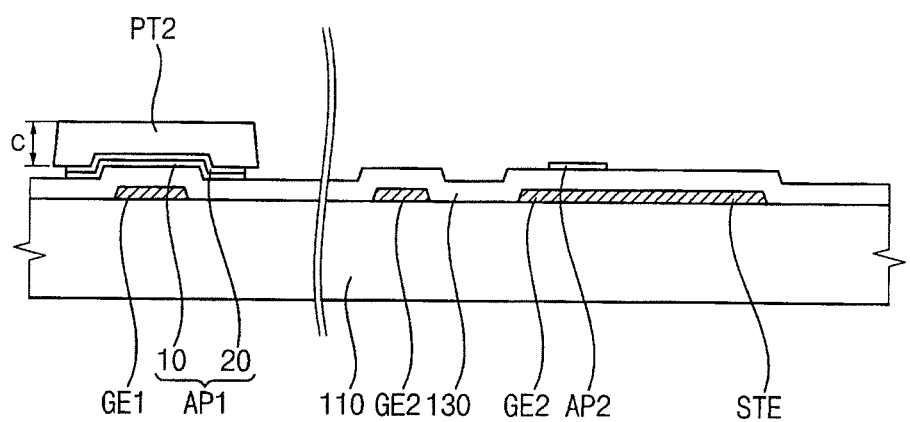

Referring to FIG. 19C, the second thickness portion TH2 may be removed to form a first residual pattern PT2 which exposes the third pattern 30.

The second thickness portion TH2 may be removed by ashing a portion of the first photoresist pattern PT1. In removing the second thickness portion TH2, a portion of the first thickness portion TH1 may remain because the first thickness portion TH1 is thicker than the second thickness portion TH2. A thickness "c" of the first residual pattern PT2 may be substantially the same as a difference between the first thickness "a" and the second thickness "b."

The third pattern 30 may be removed using the residual pattern PT2 which serves as an etching blocking layer to expose the driving active pattern AP2. Thus, the switching active pattern AP1, which includes the first and second patterns 10 and 20, and the driving active pattern AP2 may be formed on the base substrate 110 including the first insulation layer 130. The switching active pattern AP1 and the driving active pattern AP2 may be formed by using only one mask, and thus the number of masks used in manufacturing the display substrate 107 may be minimized.

Figure 19D:
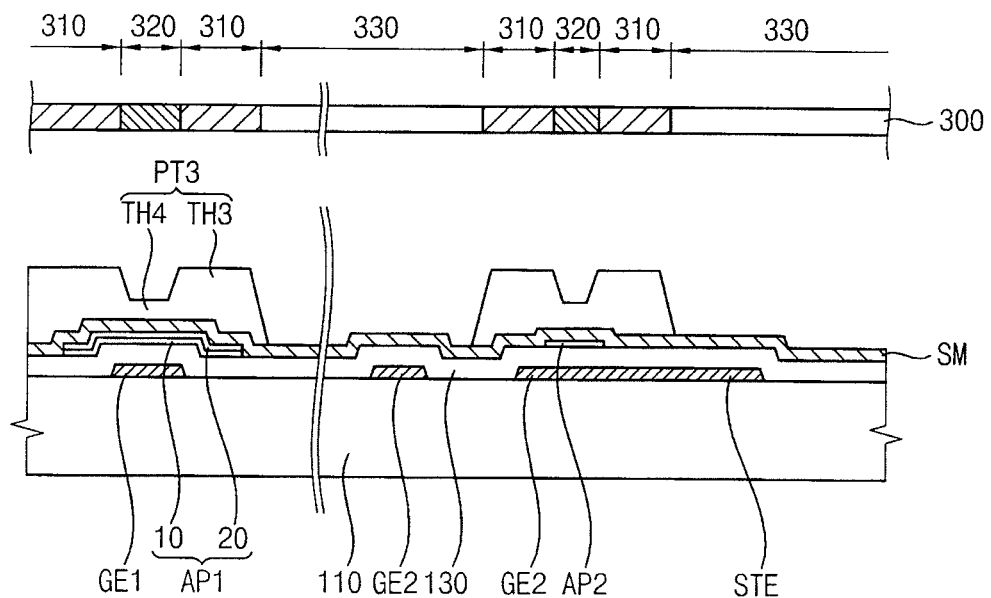

Referring to FIG. 19D, a source metal layer SM may be formed on the base substrate 110 including the switching active pattern AP1 and the driving active pattern AP2. A second photoresist layer may be formed on the base substrate 110 including the source metal layer SM. The second photoresist layer may be patterned using a second mask 300. The second mask 300 may include a light-blocking part 310, a half light-transmitting part 320 and a light-transmitting part 330. The second photoresist layer may be developed to form a second photoresist pattern PT3. When the second photoresist layer is developed, a third thickness portion TH3 may be formed on the base substrate 110 corresponding to the light-blocking part 310, and a fourth thickness portion TH4 may be formed on the base substrate 110 corresponding the half light-transmitting part 320. The third thickness portion TH3 may have a third thickness and the fourth thickness portion TH4 may have a fourth thickness. The fourth thickness may be smaller than the third thickness. The second photoresist layer corresponding to the light-transmitting part 330 may be removed to expose the source metal layer SM.

Figure 19E:
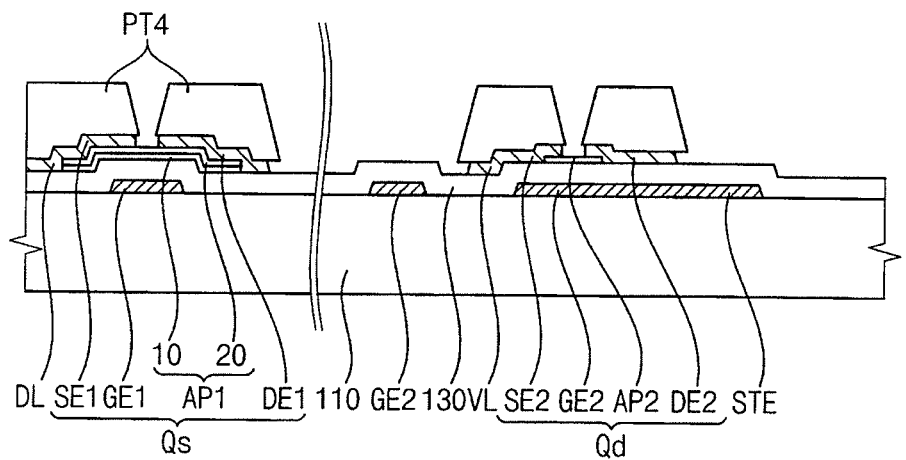

Referring to FIG. 19E, the source metal layer SM may be patterned using the second photoresist pattern PT3. The second photoresist pattern PT3 may be ashed to remove the fourth thickness portion TH4. Thus, a second residual pattern PT4 may be formed on the base substrate 110.

The source metal layer patterned may be patterned again using the second residual pattern PT4 as an etching blocking layer to form a source pattern. The source pattern may include the switching input electrode SE1, the switching output electrode DE1, the driving input electrode SE2, and the driving output electrode DE2. A portion of the source metal layer SM on the switching control electrode GE1 may be removed using the second residual pattern PT4 to form the switching input and output electrodes SE1 and DE1. A portion of the source metal layer SM on the first driving control electrode GE2 may be removed using the second residual pattern PT4 to form the driving input and output electrodes SE2 and DE2. Thus, the switching transistor Qs and the driving transistor Qd may be formed on the base substrate 110.

Figure 19F:
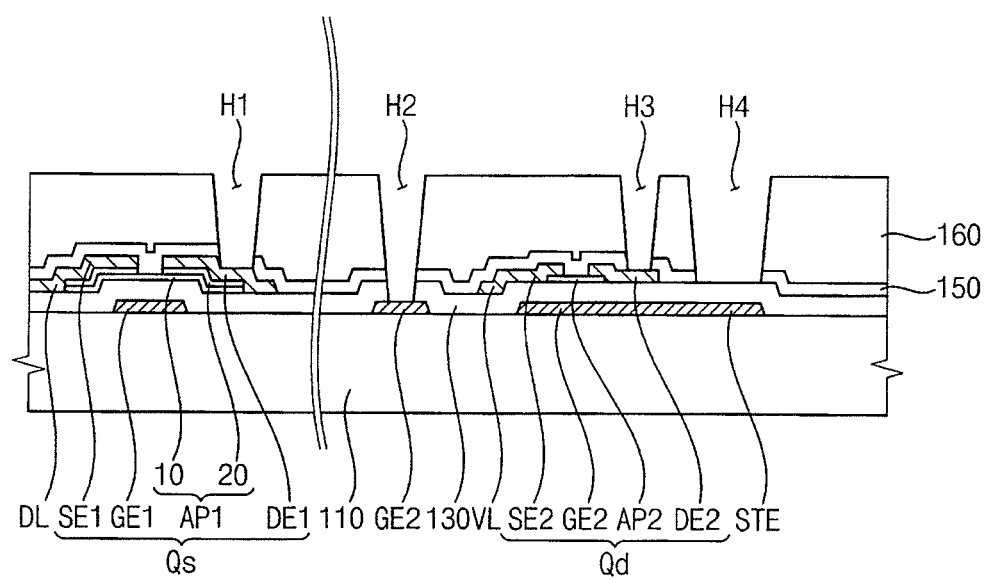

Referring to FIGS. 18 and 19F, the second insulation layer 150 and the third insulation layer 160 may be formed on the base substrate 110 including the source pattern. The second insulation layer 150 may comprise, for example, silicon oxide, or silicon nitride. The third insulation layer 160 may comprise, for example, photosensitive organic material.

The first, second and third insulation layers 130, 150 and 160 may be patterned to form the first hole H1, the second hole H2, the third hole H3, and the fourth hole H4. The first connection electrode CE1 and the anode AN may be formed on the third insulation layer 160 which is patterned. The light-emitting element Qe including the anode AN may be formed on the base substrate 110.

Processes of patterning the first to third insulation layers 130, 150 and 160, forming the first connection electrode CE1 and the anode AN, and forming the light-emitting element Qe are substantially the same as the processes illustrated in connection with FIGS. 4D to 4G and FIG. 5.

Thus, the display substrate 107 including the switching transistor Qs, the driving transistor Qd and the light-emitting element Qe may be manufactured.

Figure 20:
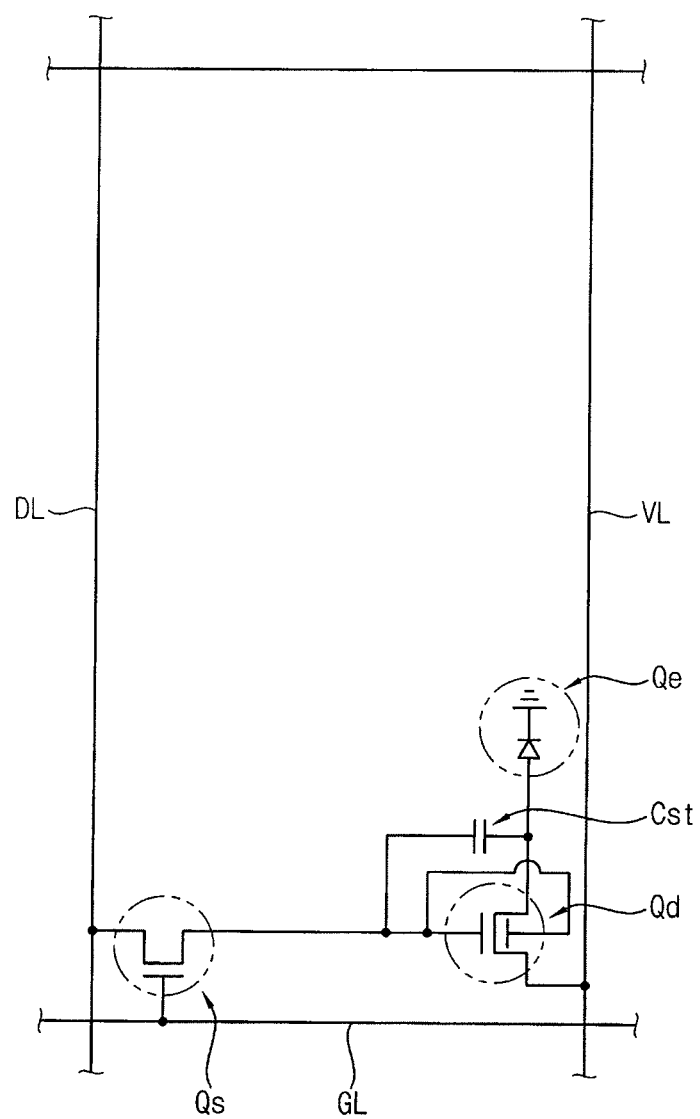
FIG. 20 is a circuit diagram illustrating a display substrate according to an exemplary embodiment of the present invention.
Figure 21:
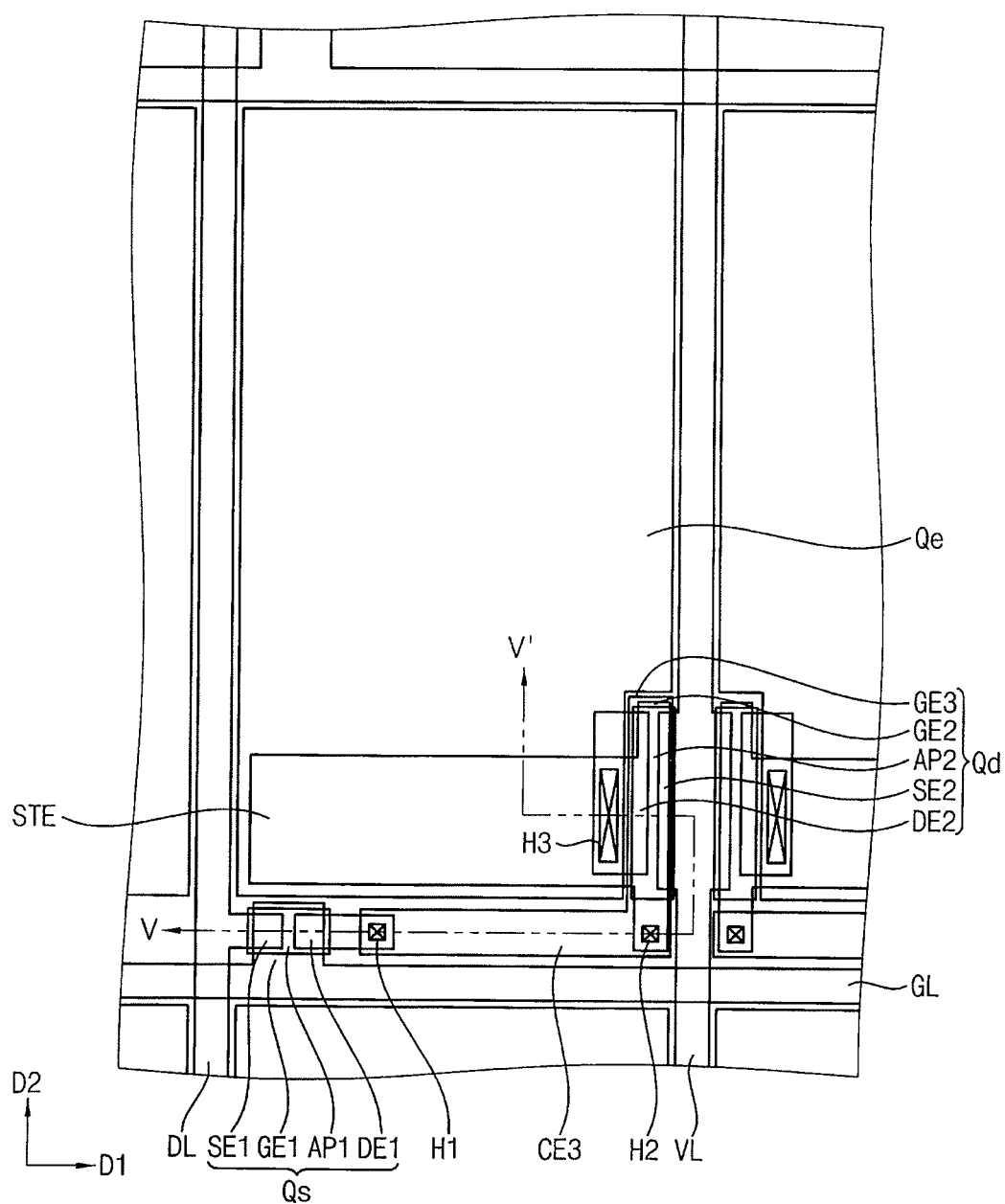
FIG. 21 is a plan view illustrating a display substrate according to an exemplary embodiment of the present invention.
Figure 22:
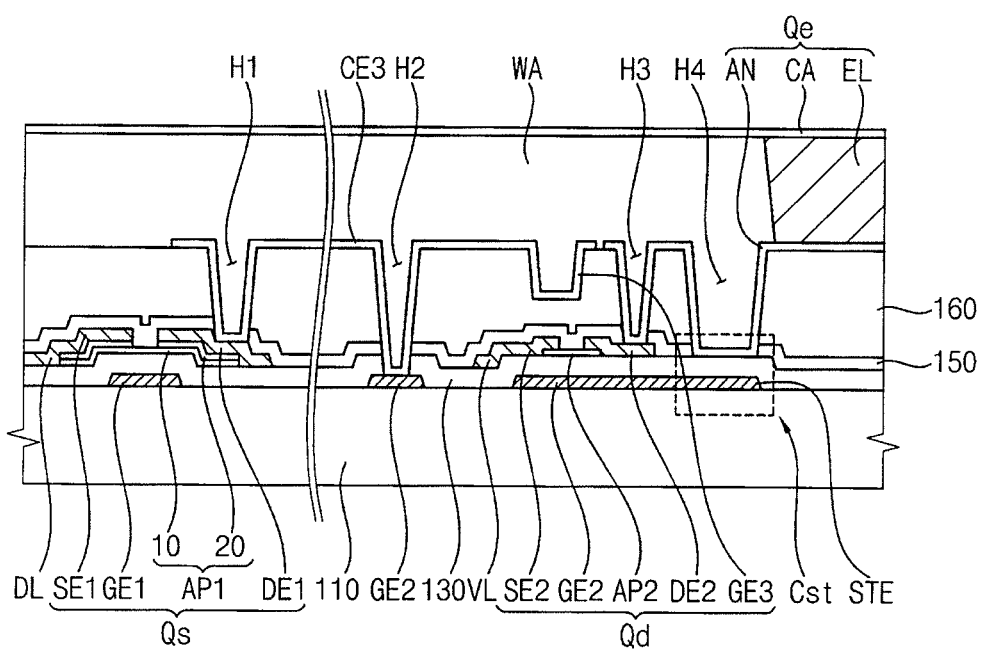
FIG. 22 is a cross-sectional view taken along the line V-V' shown in FIG. 21 according to an exemplary embodiment of the present invention.

FIG. 20 is a circuit diagram illustrating a display substrate according to an exemplary embodiment of the present invention. FIG. 21 is a plan view illustrating a display substrate according to an exemplary embodiment of the present invention. FIG. 22 is a cross-sectional view taken along the line V-V' shown in FIG. 21 according to an exemplary embodiment of the present invention.

Referring to FIGS. 20, 21 and 22, the display substrate 107 includes the plurality of signal lines GL, DL and VL and the plurality of pixel units connected to the signal lines GL, DL and VL. The pixel units may be arranged substantially in a matrix. The signal lines GL, DL and VL may include the gate line GL, the data line DL and the driving voltage line VL. Each of the pixel units may include the switching transistor Qs, the driving transistor Qd, the light-emitting element Qe and the storage capacitor Cst.

In FIGS. 20, 21 and 22, a display substrate 108 is substantially the same as the display substrate 101 except for the driving transistor Qd.

The switching transistor Qs may be electrically connected to the driving transistor Qd. The driving transistor Qd may be electrically connected to the light-emitting element Qe. The switching transistor Qs may be connected to the driving transistor Qd through a third connection electrode CE3. The third connection electrode CE3 may be connected to a second driving control electrode GE3 of the driving transistor Qd.

The switching transistor Qs may include the switching control electrode GE1, a switching input electrode SE1, a switching output electrode DE1, and a switching active pattern AP1. The switching control electrode GE1 may be connected to the gate line GL, the switching input electrode SE1 may be connected to the data line DL, and the switching output electrode DE1 may be spaced apart from the switching input electrode SE1. The switching active pattern AP1 may include the first pattern 10 comprising, for example, a metal oxide and the second pattern 20 comprising, for example, amorphous silicon.

The driving transistor Qd may include a first driving control electrode GE1, a driving active pattern AP2, a driving input electrode SE2, a driving output electrode DE2, and the second driving control electrode GE3. The first driving control electrode GE2 may be connected to the switching output electrode DE1 through the third connection electrode CE3. The third connection electrode CE3 may contact the switching output electrode DE1 through a first hole H1 and contact the first driving control electrode GE2 through a second hole H2. A portion of the switching output electrode DE1 may be exposed through the first hole H1. A portion of the first driving control electrode GE2 may be exposed through the second hole H2. The driving active pattern AP2 may be formed on the first driving control electrode GE2. The driving active pattern AP2 may comprise a metal oxide. The driving input/output electrodes SE2 and DE2 may be formed on the driving active pattern AP2 and may overlap both edge portions of the first driving control electrode GE2. The second driving control electrode GE3 may be formed on the driving input/output electrodes SE2 and DE2. The second driving control electrode GE3 may be connected to the driving input/output electrodes SE2 and DE2 through the third connection electrode CE3. The second driving control electrode GE3 may extend from the third connection electrode CE and disposed opposite to the first driving control electrode GE2.

A second insulation layer 150 and a third insulation layer 160 may be formed on the base substrate 110 including the driving input/output electrodes SE2 and DE2. The third insulation layer 160 may include a groove formed in a region corresponding to the first driving control electrode GE2. The groove may be formed by removing the portion of the third insulation layer 160. The second driving control electrode GE3 may be formed in the groove. The second driving control electrode GE3 may be connected to the switching transistor Qs through the third connection electrode CE3. The second driving control electrode GE3 may be electrically connected to the switching output electrode DE1. The second driving control electrode GE3 may be formed by patterning a conductive layer which forms the anode AN of the light-emitting element Qe and the third connection electrode CE3. The driving transistor Qd may have a double gate structure or a dual gate structure including the first and second driving control electrodes GE2 and GE3.

According to the first and second driving control electrodes GE2 and GE3, the driving active pattern AP2 may transmit electrons from the driving input electrode SE2 to the driving output electrode DE2. Thus, the light-emitting element may receive the sufficient current to improve the electric character of the driving transistor Qd.

A method of manufacturing the display substrate 108 is illustrated in connection with FIG. 21 according to an exemplary embodiment of the present invention. In the method, processes of forming a gate pattern, forming the switching active pattern and the driving active pattern using only one mask, forming a source pattern may be substantially the same as the processes illustrated in connection with FIGS. 19A to 19E.

Referring to FIG. 21, the second insulation layer 150 and the third insulation layer 160 may be formed on the base substrate 110 including a source pattern. The source pattern may include the switching input and output electrodes SE1 and DE1.

The first, second and third insulation layers 130, 150 and 160 may be patterned to form the first hole H1, the second hole H2, the third hole H3, the fourth hole H4, and the groove. The first to fourth holes H1, H2, H3 and H4 may be substantially the same as the holes illustrated in connection with FIG. 19F. The groove may be formed by removing a portion of the third insulation layer 160. The groove may be formed on the first driving control electrode GE2.

A transparent electrode layer may be formed on the base substrate 110 including the first to fourth holes H1, H2, H3 and H4 and the groove. The transparent electrode layer may be patterned to form the third connection electrode CE3, the second driving control electrode GE3, and the anode AN of the light-emitting element Qe.

In an exemplary embodiment, processes of forming the insulation wall WA, the light-emitting layer EL and the cathode CA on the base substrate 110 having the anode AN are substantially the same as the processes of forming the insulation wall WA, the light-emitting layer EL and the cathode CA described above in connection with FIGS. 4A-4G. After the processes, the display substrate 108 including the switching transistor Qs, the driving transistor Qd and the light-emitting element Qe may be manufactured.

In an exemplary embodiment, the driving transistor Qd includes an active pattern comprising a metal oxide. Thus, the mobility and the stability of the driving transistor Qd may be increased. In an exemplary embodiment, a display substrate, which includes the switching transistor Qs and the driving transistor Qd, may be manufactured at a low temperature. Thus, a misalignment of the display substrate may be prevented and the reliability of manufacturing the display may be improved.

Although exemplary embodiments of the present invention have been described herein with reference to the accompanying drawings, it is to be understood that the present invention should not be limited thereto and that various other changes and modifications may be affected therein by one of ordinary skill in the related art without departing from the scope or spirit of the invention. All such changes and modifications are intended to be included within the scope of the invention.

What is claimed is:
1. A method of manufacturing a display substrate, the method comprising:
    forming a first conductive pattern including a gate line, a first switching control electrode connected to the gate line and a first driving control electrode;
    forming a second conductive pattern including a data line extending in a first direction substantially perpendicular to the gate line extending in a second direction, a driving voltage line, a switching input electrode connected to the data line, a switching output electrode spaced apart from the switching output electrode, a driving input electrode connected to the driving voltage line, and a driving output electrode spaced apart from the driving input electrode;

forming a switching active pattern and a driving active pattern, the switching active pattern comprising amorphous silicon is formed in a region corresponding to the switching control electrode, the driving active pattern comprising a metal oxide is formed in a region corresponding to the first driving control electrode; and forming a light-emitting element electrically connected to the driving output electrode, wherein the switching output electrode is electrically connected to the first driving control electrode, wherein the second conductive pattern is formed on a base substrate including a first conductive pattern, and wherein forming the driving active pattern comprises:

forming a first active layer and a second active layer on the base substrate including the first conductive pattern, the first active layer comprising the metal oxide, the second active layer comprising the amorphous silicon;

forming a photoresist pattern on the second active layer, the photoresist pattern including a first thickness portion corresponding to the switching control electrode, and a second thickness portion corresponding to the first driving control electrode is thinner than the first thickness portion; and patterning the first and second active layers using the photoresist pattern.

2. The method of claim 1, wherein patterning the first and second active layers comprises:

patterning the first and second active layers using the photoresist pattern to form a first pattern, a second pattern, the driving active pattern and a third pattern, wherein the first pattern is disposed on the switching control electrode and comprises the metal oxide, the second pattern is disposed on the first pattern and comprises the amorphous silicon, and the third pattern is formed on the driving active pattern and comprises the amorphous silicon;

removing the second thickness portion to form a residual pattern exposing the third pattern; and removing the third pattern to expose the driving active pattern.

3. The method of claim 1, wherein forming the light-emitting element comprises:

forming a third conductive layer on the second conductive pattern; and patterning the third conductive layer to form a second driving control electrode overlapping the driving input electrode and the driving output electrode.

4. The method of claim 3, wherein forming the light-emitting element further comprises:

patterning the third conductive layer to form an anode electrically connected to the driving output electrode;

forming a light-emitting layer on the anode; and forming a cathode on the light-emitting layer.

5. The method of claim 4, further comprising:

forming an insulation layer between the second conductive pattern and the light-emitting element, the insulation layer including a first contact hole, a second contact hole and a groove, wherein the driving output electrode is connected to the light-emitting element through the first contact hole, the driving output electrode is connected to the second control electrode, and the groove is formed in a region corresponding to the first driving control electrode.

* * * * *